US012760222B2

(12) United States Patent
Kim et al.

(10) Patent No.: US 12,760,222 B2
(45) **Date of Patent: *Oct. 13, 2026**

(54) SEMICONDUCTOR NANOCRYSTAL, LIGHT-EMITTING FILM, PRODUCTION METHOD OF THE LIGHT-EMITTING FILM, LIGHT EMITTING DEVICE, AND DISPLAY DEVICE

(71) Applicant: SAMSUNG ELECTRONICS CO., LTD., Suwon-si (KR)

(72) Inventors: Kwanghee Kim, Seoul (KR); Tae Hyung Kim, Seoul (KR); Hongkyu Seo, Anyang-si (KR); Won Sik Yoon, Seoul (KR); Jaeyong Lee, Suwon-si (KR); Eun Joo Jang, Suwon-si (KR); Oul Cho, Suwon-si (KR)

(73) Assignees: SAMSUNG DISPLAY CO., LTD., Gyeonggi-Do (KR); SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/535,107

(22) Filed: Dec. 11, 2023

(65) Prior Publication Data

US 2024/0141231 A1 May 2, 2024

Related U.S. Application Data

(63) Continuation of application No. 17/308,344, filed on May 5, 2021, now Pat. No. 11,884,858.

(30) Foreign Application Priority Data

Jun. 18, 2020 (KR) ........................ 10-2020-0074436
Mar. 26, 2021 (KR) ........................ 10-2021-0039655

(51) Int. Cl.
*C09K 11/70* (2006.01)
*B82Y 20/00* (2011.01)
(Continued)

(52) U.S. Cl.
CPC .......... *C09K 11/703* (2013.01); *C09K 11/883* (2013.01); *B82Y 20/00* (2013.01);
(Continued)

(58) Field of Classification Search
CPC .................................................... C09K 11/703
See application file for complete search history.

(56) References Cited

U.S. PATENT DOCUMENTS 7,615,800 B2 11/2009 Kahen
8,685,781 B2 4/2014 Semonin et al.
(Continued)

FOREIGN PATENT DOCUMENTS

JP 5043848 B2 10/2012
KR 20110004775 A 1/2011
(Continued)

OTHER PUBLICATIONS

Eunjoo Jang, et al., White-Light-Emitting Diodes with Quantum Dot Color Converters for Display Backlights, Adv. Mater. 2010, 22, 3076-3080.

(Continued)

*Primary Examiner* — William D Young
(74) *Attorney, Agent, or Firm* — CANTOR COLBURN LLP

(57) ABSTRACT

A semiconductor nanocrystal including an anion of an inorganic metal salt and a first organic ligand bound to a surface of the semiconductor nanocrystal, wherein the first organic ligand includes a substituted or unsubstituted C6 to C30 aromatic ring group and a carboxylate, a substituted or
(Continued)

unsubstituted C3 to C30 aromatic hetero cyclic group and a carboxylate, or a combination thereof.

16 Claims, 11 Drawing Sheets

(51) Int. Cl.

| | |
|---|---|
| ***B82Y 30/00*** | (2011.01) |
| ***B82Y 40/00*** | (2011.01) |
| ***C09K 11/88*** | (2006.01) |
| ***H10K 50/115*** | (2023.01) |
| ***H10K 50/16*** | (2023.01) |
| ***H10K 50/17*** | (2023.01) |

(52) U.S. Cl.

CPC ............... *B82Y 30/00* (2013.01); *B82Y 40/00* (2013.01); *H10K 50/115* (2023.02); *H10K 50/16* (2023.02); *H10K 50/171* (2023.02)

(56) References Cited

U.S. PATENT DOCUMENTS

| | | | | |
|---|---|---|---|---|
| 9,093,656 | B2 | 7/2015 | Pan et al. | |
| 9,943,840 | B2 | 4/2018 | Shaffer et al. | |
| 9,963,632 | B2 | 5/2018 | Koh et al. | |
| 10,074,770 | B2 | 9/2018 | Park et al. | |
| 10,429,033 | B2 | 10/2019 | Yoon et al. | |
| 10,457,865 | B2 | 10/2019 | Xie | |
| 10,541,134 | B2 | 1/2020 | Kurley et al. | |
| 10,559,712 | B2 | 2/2020 | Park et al. | |
| 10,759,992 | B2 | 9/2020 | Jang et al. | |
| 10,975,299 | B2 | 4/2021 | Kim et al. | |
| 10,988,685 | B2 | 4/2021 | Ahn et al. | |
| 11,133,468 | B2 | 9/2021 | Chang et al. | |
| 11,591,515 | B2 | 2/2023 | Kim et al. | |
| 11,643,597 | B2 | 5/2023 | Kim et al. | |
| 11,884,858 | B2 * | 1/2024 | Kim | C09K 11/02 |
| 11,898,073 | B2 | 2/2024 | Jang et al. | |
| 12,060,510 | B2 | 8/2024 | Kim et al. | |
| 2011/0006281 | A1 * | 1/2011 | Jang | C09K 11/565 252/500 |
| 2017/0269046 | A1 | 9/2017 | Maloney et al. | |
| 2017/0362255 | A1 | 12/2017 | Beard et al. | |
| 2018/0151817 | A1 * | 5/2018 | Cho | H10K 50/115 |
| 2019/0326533 | A1 | 10/2019 | Kim et al. | |
| 2020/0083470 | A1 * | 3/2020 | Chung | H10K 50/115 |
| 2020/0172802 | A1 | 6/2020 | Ahn et al. | |
| 2020/0220043 | A1 | 7/2020 | Park et al. | |
| 2021/0395611 | A1 | 12/2021 | Kim | |
| 2022/0145171 | A1 * | 5/2022 | Wang | C07F 7/24 |

FOREIGN PATENT DOCUMENTS

| | | | |
|---|---|---|---|
| KR | 20170044791 | A | 4/2017 |
| KR | 20170074585 | A | 6/2017 |
| KR | 20180059363 | A | 6/2018 |
| KR | 20190018309 | A | 2/2019 |
| KR | 20190123694 | A | 11/2019 |
| KR | 20190136801 | A | 12/2019 |
| KR | 20200000742 | A | 1/2020 |
| WO | 2017079225 | A1 | 5/2017 |

OTHER PUBLICATIONS

Seth Coe, Wing-Keung Woo, Moungi Bawendi & Vladimir Bulovic., Electroluminescence from single monolayers of nanocrystals in molecular organic devices, Nature 2000, 420, 800-803.

Tae-Ho Kim, et al., Full-colour quantum dot displays fabricated by transfer printing, Nature Photonics, vol. 5, 176-182, Mar. 2011, www.nature.com/naturephotonics.

English Translation of Office Action dated Apr. 9, 2025 of the corresponding Korean Patent Application No. 10-2021-0039655, 10 pp.

Office Action dated Apr. 9, 2025 of the corresponding Korean Patent Application No. 10-2021-0039655, 8 pp.

Notice of Allowance dated Dec. 22, 2025, of the corresponding Korean Patent Application No. 10-2021-0039655 with English Translation, 5pp.

* cited by examiner

SEMICONDUCTOR NANOCRYSTAL, LIGHT-EMITTING FILM, PRODUCTION METHOD OF THE LIGHT-EMITTING FILM, LIGHT EMITTING DEVICE, AND DISPLAY DEVICE

CROSS-REFERENCE TO RELATED APPLICATION

This is a continuation application of U.S. patent application Ser. No. 17/308,344 filed May 5, 2021, now U.S. Pat. No. 11,884,858, which in turn claims priority to Korean Patent Application No. 10-2020-0074436 filed in the Korean Intellectual Property Office on Jun. 18, 2020 and Korean Patent Application No. 10-2021-0039655 filed in the Korean Intellectual Property Office on Mar. 26, 2021, and all the benefits accruing therefrom under 35 U.S.C. §§ 119, 120, the entire contents of which are incorporated herein by reference.

BACKGROUND

1. Field

A semiconductor nanocrystal-ligand composite, a light-emitting film, a method of making the light-emitting film, a light emitting device, and a display device are disclosed.

2. Description of the Related Art

A semiconductor nanocrystal (i.e. a quantum dot) may have different bandgap energies depending in-part upon the size and composition of the nanocrystal, and thus may emit light of various photoluminescence wavelengths. A semiconductor nanocrystal has a theoretical quantum yield (QY) of 100% and emits light having a high color purity (e.g., full width at half maximum (FWHM) of less than or equal to about 40 nm), and thus, the semiconductor nanocrystal as a light emitting material may exhibit greater luminous efficiency and an improvement in color reproducibility.

In a wet chemical method for making a semiconductor nanocrystal, organic substances such as a dispersing agent may be coordinated on the surface of semiconductor nanocrystal during crystal growth, and as a result, semiconductor nanocrystals having uniform and controlled size with good photoluminescence characteristics and stability may be achieved. However, the organic substances tend to be insulating materials, and thus, may interfere with charge flow such as the flow of electrons, holes, and the like to the nanocrystals. Accordingly, if such prepared semiconductor nanocrystals are used in a device, e.g., a display device, charge flow may be impaired, which may in turn result in a decrease in device efficiency, life-span, and/or a consequent increase in driving voltage.

SUMMARY

An embodiment provides a semiconductor nanocrystal capable of improving charge mobility to improve device efficiency and life-span as well as reduce the driving voltage of the device.

Another embodiment provides a light-emitting film including the semiconductor nanocrystal.

Another embodiment provides a method of making the light-emitting film.

Another embodiment provides a light emitting device including the light-emitting film.

Another embodiment provides a display device including the light emitting device.

According to an embodiment, a semiconductor nanocrystal includes an anion of an inorganic metal salt and a first organic ligand bound to a surface of the semiconductor nanocrystal, wherein the first organic ligand includes a substituted or unsubstituted C6 to C30 aromatic ring group and a carboxylate group, a substituted or unsubstituted C3 to C30 aromatic heterocyclic group and a carboxylate group, or a combination thereof.

The semiconductor nanocrystal may include a core including a first semiconductor nanocrystal, and a shell disposed on the core, the shell including a composition different than that of the first semiconductor nanocrystal.

The first semiconductor nanocrystal may include InP, InZnP, ZnSe, ZnSeTe, or a combination thereof.

The second semiconductor nanocrystal may include zinc and sulfur in an outermost shell layer.

The inorganic metal salt may include an inorganic metal halide, an inorganic metal sulfate, an inorganic metal nitrate, an inorganic metal thiocyanate, or a combination thereof.

The metal of the inorganic metal salt is zinc (Zn), indium (In), gallium (Ga), magnesium (Mg), lithium (Li), nickel (Ni), tin (Sn), copper (Cu), silver (Ag), cobalt (Co), or a combination thereof.

The inorganic metal salt may include zinc chloride, zinc bromide, zinc iodide, zinc nitrate, zinc sulfate, zinc thiocyanate, indium chloride, indium bromide, indium iodide, indium nitrate, indium sulfate, indium thiocyanate, gallium chloride, gallium bromide, gallium iodide, gallium nitrate, gallium sulfate, gallium thiocyanate, magnesium chloride, magnesium bromide, magnesium iodide, magnesium nitrate, magnesium sulfate, magnesium thiocyanate, lithium chloride, lithium bromide, lithium Iodide, lithium nitrate, lithium sulfate, lithium thiocyanate, nickel chloride, nickel bromide, nickel iodide, nickel nitrate, nickel sulfate, nickel thiocyanate, tin chloride, tin bromide, tin iodide, tin nitrate, tin sulfate, tin thiocyanate, copper chloride, copper bromide, copper iodide, copper nitrate, copper sulfate, copper thiocyanate, silver chloride, silver bromide, silver iodide, silver nitrate, silver sulfate, silver thiocyanate, cobalt chloride, cobalt bromide, cobalt iodide, cobalt nitrate, cobalt sulfate, cobalt thiocyanate, or a combination thereof.

The first organic ligand may be a compound represented by Chemical Formula 1.

Chemical Formula 1

$$X-L-Ar_1-[Y]_n$$

In Chemical Formula 1, $Ar_1$ is a substituted or unsubstituted monocyclic aromatic ring group, a substituted or unsubstituted condensed polycyclic aromatic ring group, or a combination thereof joined by a linker, an aromatic ring group including two or more independently substituted or unsubstituted monocyclic aromatic ring groups, or two or more independently substituted or unsubstituted condensed polycyclic aromatic ring groups, each of which is joined by a linker, L is a single bond, a substituted or unsubstituted C1 to C30 alkylene group, or an unsaturated linker of $-CR^a=CR^b-$ or $-C\equiv C-$ (wherein, $R^a$ and $R^b$ are independently hydrogen, or an optionally substituted C1 to C10 alkyl group), X is a carboxylate group, Y is a hydroxy group, a halogen, an amine group, or a nitro group, and n is an integer of 0 to 6.

The aromatic ring group may include a structural moiety of benzene, biphenyl, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopurine, isoquinoline, purine, or a combination thereof.

The first organic ligand may include benzoate, hydroxyl benzoate, halo-benzoate, amino-benzoate, nitro-benzoate, 4-biphenyl carboxylate, cinnamate acid, or a combination thereof.

The semiconductor nanocrystal may further include a second organic ligand including an anion of RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, or $RH_2POOH$ (wherein, R and R' are independently hydrogen, C1 to C40 substituted or unsubstituted aliphatic hydrocarbon, or C6 to C40 substituted or unsubstituted aromatic hydrocarbon, or a combination thereof, and in each ligand, at least one R is not hydrogen), which is bound to the surface of the semiconductor nanocrystal.

A weight ratio of the anion of the inorganic metal salt and the first organic ligand may be about 30 to 60:10 to 30.

A weight ratio of the second organic ligand, the anion of the inorganic metal salt, and the first organic ligand may be about 30 to 60:30 to 60:10 to 30.

According to another embodiment, a light-emitting film including a plurality of the semiconductor nanocrystals is provided.

According to another embodiment, a method of producing the light-emitting film includes disposing a film including a plurality of semiconductor nanocrystals on a substrate, and treating the plurality of semiconductor nanocrystals with a solution including an inorganic metal salt in a polar solvent to bind an anion of the inorganic metal salt to the plurality of semiconductor nanocrystals, and treating the plurality of semiconductor nanocrystals with a solution including a first organic ligand to bind the first organic ligand to the plurality of semiconductor nanocrystals, wherein the first organic ligand includes a substituted or unsubstituted C6 to C30 aromatic ring group and a carboxylate group, a substituted or unsubstituted C3 to C30 aromatic hetero cyclic group and a carboxylate group, or a combination thereof.

According to another embodiment, a light emitting device includes a first electrode and a second electrode each having a surface opposite the other, and the light emitting layer disposed between the first electrode and the second electrode.

The light emitting device may further include an electron auxiliary layer including an electron injecting layer (EIL), an electron transporting layer (ETL), a hole blocking layer (HBL), or a combination thereof, the electron auxiliary layer disposed between the second electrode and the light-emitting film.

The electron auxiliary layer may include nanoparticles including zinc metal oxide.

The zinc metal oxide may be represented by Chemical Formula 2.

$Zn_{1-x}M_xO$ Chemical Formula 2

In Chemical Formula 2, M is Mg, Ca, Zr, W, Li, Ti, Y, Al, or a combination thereof, and $0 \leq x \leq 0.5$.

Another embodiment provides a display device including the light emitting device.

The semiconductor nanocrystal according to an embodiment may improve charge mobility, thereby improving efficiency and life-span of a device, and reducing the driving voltage.

The semiconductor nanocrystal may be used in a light emitting device (e.g., an electroluminescent device, a QD color converter), and various display devices (e.g., QD-LED), biological labeling (biosensor, bio-imaging), photodetector, a solar cell (e.g., QD photoelectric device), a polymer composite, or an organic-inorganic hybrid composite.

DETAILED DESCRIPTION

Figure 1:
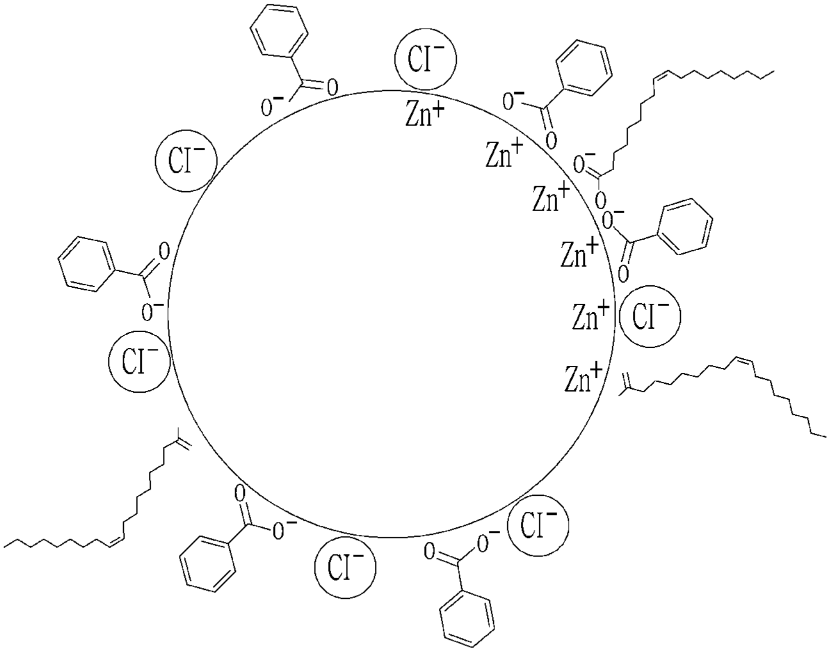
FIG. 1 is a schematic representation illustrating a semiconductor nanocrystal according to an embodiment.

Advantages and characteristics of this disclosure, and a method for achieving the same, will become evident referring to the following exemplary embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

If not defined otherwise, all terms (including technical and scientific terms) in the specification may be defined as commonly understood by one skilled in the art. It will be further understood that terms, such as those terms defined in a common dictionary should be interpreted as having a meaning that is consistent with their meaning in the context of the relevant art, and may not be interpreted ideally or exaggeratedly unless clearly defined. The terminology used herein is for the purpose of describing particular embodiments and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprise" and variations such as "comprises", "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5% of the stated value.

As used herein, when a definition is not otherwise provided, "substituted" refers to a compound or a moiety wherein at least one of hydrogen atoms thereof is replaced by a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group (—NRR' wherein R and R' are independently hydrogen or a C1 to C6 alkyl group), an azido group ($—N_3$), an amidino group ($—C(=NH)NH_2$)), a hydrazino group ($—NHNH_2$), a hydrazono group ($=N(NH_2)$)), an aldehyde group (—C(=O)H), a carbamoyl group ($—C(O)NH_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), and a combination thereof.

As used herein, "monocyclic aromatic ring group" may refer to a cyclic group providing a conjugated aromatic ring (e.g., a C6 to C12 aryl group or a C6 to C8 aryl group) or a heterocyclic group providing a conjugated aromatic ring (e.g., a C2 to C12 heteroaryl group or a C2 to C4 heteroaryl group).

As used herein, "condensed polycyclic aromatic ring group" may refer to an aromatic ring group that includes at least two rings that are fused to one another, where at least one of the fused rings is aromatic , for example a C8 to C20 aryl group, for example a C8 to C15 aryl group, or a C4 to C20 heteroaryl group, for example a C4 to C15 heteroaryl group.

As used herein, "hetero" may refer to one including one or more (e.g., 1 to 3) heteroatom of N, O, S, Si, P, or a combination thereof.

As used herein, "Group" may refer to a group of Periodic Table.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

A semiconductor nanocrystal (also referred to as a quantum dot (QD)) may absorb light from an excitation source and emit light corresponding to its bandgap energy. For example, semiconductor nanocrystals may have narrower bandgap energies and emission wavelengths may increase as the particle size of the nanocrystal increases. Since semiconductor nanocrystals have merits such as high luminous efficiency (quantum yield), high color purity, high stability, wavelength control capability (spectral tenability), and the like, they have attracted attention as a light emitting material in various fields such as display devices, energy devices, and bioluminescence devices.

A semiconductor nanocrystal light emitting device (QD-LED) is a self-luminous device that uses a semiconductor nanocrystal with high quantum efficiency as a light emitting center of a light emitting layer. Compared to organic light-emitting bodies, light emitted from semiconductor nanocrystals, which are inorganic semiconductors, have an advantage in that a self-luminous LED having a very narrow emission spectrum with high efficiency can be achieved.

QD-LED is a light emitting diode that has a structure similar to that of OLED and uses inorganic QD's instead of organic materials in a light emitting layer, and the basic operation principle is essentially the same as that of OLED. However, in order to drive the QD-LED with high efficiency, high brightness and long life-span, not only should the number of holes and the number of electrons (collectively, charge carriers entering the light emitting layer be sufficiently high, but also the quantitative balance between the holes and electrons is very important.

In order to achieve an increase in the number charge carriers as well as the desired balance of charge carriers, an injection barrier from a hole transport layer (HTL) into the semiconductor nanocrystal has to be low, and similarly, an injection barrier from the electron transporting layer (ETL) into the semiconductor nanocrystal has to be low.

In the case of holes, efforts are being made to develop HTL materials with improved hole mobility, or a HTL material that nearly matches a HOMO level of the semiconductor nanocrystal. Similarly, in the case of electrons, metal doping is applied in order to control conduction characteristics of the ETL layer, or additives are mixed in order to improve and/or control electron conduction characteristics.

According to an embodiment, a semiconductor nanocrystal includes an anion of an inorganic metal salt and a first organic ligand bound to a surface of the semiconductor nanocrystal, wherein the first organic ligand includes a substituted or unsubstituted C6 to C30 aromatic ring group and a carboxylate group, a substituted or unsubstituted C3 to C30 aromatic heterocyclic group and a carboxylate group, or a combination thereof.

The semiconductor nanocrystal improves device characteristics to provide a light emitting device with excellent life-span by mixing and replacing the surface ligands of the semiconductor nanocrystal with the anion of the inorganic metal salt and the first organic ligand, and thereby, adjusting conduction characteristics of a light-emitting film including the semiconductor nanocrystal.

The semiconductor nanocrystals may include a Group II-VI compound, a Group III-V compound, a Group IV-VI compound, a Group IV element or compound, a Group compound, a Group I-II-IV-VI compound, or a combination thereof.

The light-emitting film (or semiconductor nanocrystals) may not include harmful heavy metals such as cadmium, lead, mercury, or a combination thereof. The Group II-VI compound includes a binary element compound selected from ZnS, ZnSe, ZnTe, ZnO, HgS, HgSe, HgTe, MgSe, MgS, and a mixture thereof; a ternary element compound selected from ZnSeS, ZnSeTe, ZnSTe, HgSeS, HgSeTe, HgSTe, HgZnS, HgZnSe, HgZnTe, MgZnSe, MgZnS, and a mixture thereof; or a quaternary element compound selected from HgZnTeS, HgZnSeS, HgZnSeTe, HgZnSTe, and a mixture thereof. The Group II-VI compound may further include a Group III metal.

The Group III-V compound includes a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; or a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II element. Examples of such semiconductor nanocrystals may include InZnP.

The Group IV-VI compound includes a binary element compound selected from SnS, SnSe, SnTe, and a mixture thereof; a ternary element compound selected from SnSeS, SnSeTe, SnSTe, and a mixture thereof; or a quaternary element compound such as SnSSeTe.

Examples of the Group compound may include CuInSe2, CuInS2, CuInGaSe, CuInGaS, but are not limited thereto.

Examples of the Group I-II-IV-VI compound include CuZnSnSe and CuZnSnS, but are not limited thereto.

The Group IV element or compound may be a single element compound selected from Si, Ge, and a mixture thereof; and a binary element compound selected from SiC, SiGe, and a mixture thereof.

Herein, the binary element compound, the ternary element compound, or the quaternary element compound may be present in a particle having a substantially uniform concentration, or may be present in a particle having different concentration distributions in the same particle. The semiconductor nanocrystal may include a core including a first semiconductor nanocrystal and a shell disposed on at least a portion (e.g., all of the surface) of the surface of the core, the shell including a second semiconductor nanocrystal having a composition different from that of the first semiconductor nanocrystal. An alloyed layer may or may not be present at the interface between the core and the shell. The alloying layer may be a homogeneous alloy, or may be a gradient alloy. The gradient alloy may have a concentration gradient wherein the concentration of an element of the shell radially changes (e.g., decreases or increases toward the core). In addition, the shell may be a multi-layered shell including two or more layers, and two adjacent layers may have different compositions. In a multi-layered shell, one or more of the layers may independently include a semiconductor nanocrystal having a single composition.

In the multi-layered shell, at least one layer may independently have an alloyed semiconductor nanocrystal. In the multi-layered shell, at least one layer may have a concentration gradient that radially changes in terms of a composition of a semiconductor nanocrystal.

In the core-shell structured semiconductor nanocrystal, a bandgap energy of the shell material may be greater than that of the core material, but is not limited thereto. The bandgap energy of the shell material may be smaller than that of the core material. In the case of the multi-layered shell, the bandgap energy of an outermost layer material of the shell may be greater than those of the core and the inner layer material of the shell (layers that are closer to the core). In the case of the multi-layered shell, a semiconductor nanocrystal of each layer is selected to have an appropriate bandgap, thereby effectively exhibiting a quantum confinement effect.

For example, the semiconductor nanocrystals may include indium, zinc, or a combination thereof. The semiconductor nanocrystals may include InP, InZnP, ZnSe, ZnSeTe, or a combination thereof. The semiconductor nanocrystals may include zinc and sulfur in an outermost layer of the shell.

An emission wavelength of the semiconductor nanocrystal may be appropriately selected. For example, the maximum photoluminescence peak of the semiconductor nanocrystal may be exhibited in a wavelength range from an ultraviolet region to a near infrared region. The maximum photoluminescence peak wavelength of the semiconductor nanocrystal may be exhibited in a range of about 420 nanometers (nm) to about 750 nm (about 460 nm to about 700 nm). In the case of a green light emitting semiconductor nanocrystal, the maximum emission peak wavelength may be exhibited within a range of about 500 nm (e.g., about 510 nm) to about 550 nm. In the case of a red light emitting semiconductor nanocrystal, the maximum emission peak wavelength may be exhibited within a range of about 600 nm (e.g., about 610 nm) to about 650 nm. In the case of a blue light emitting semiconductor nanocrystal, the maximum emission peak wavelength may be exhibited within a range of about 440 nm (e.g., about 450 nm) to about 470 nm (e.g., about 480 nm).

The semiconductor nanocrystal may exhibit a photoluminescence spectrum having a relatively narrow full width at half maximum (FWHM). For example, the semiconductor nanocrystal may have a FWHM of less than or equal to about 45 nm, for example about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm in its photoluminescence spectrum. The semiconductor nanocrystal may have a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The semiconductor nanocrystal may have a size (a particle diameter or in the case of non-spherically shaped particle, a particle diameter calculated from a two-dimensional area confirmed by an electron microscopy analysis) of about 1 nm to about 100 nm. For example, the semiconductor nanocrystal may have a size of about 1 nm to about 50 nm, for example, about 2 nm (or about 3 nm) to about 35 nm. For example, the semiconductor nanocrystal may have a size of greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. For example, the semiconductor nanocrystal may have a size of less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanocrystal may have any shape. For example, the shape of the semiconductor nanocrystal may be a sphere, a polyhedron, a pyramid, a multi-pod, a cubic, a nanotube, a nanowire, a nanofiber, a nanosheet, a nanoplate, or a combination thereof.

The semiconductor nanocrystal may be synthesized in any method. For example, a several nano-sized semiconductor nanocrystal may be synthesized by a wet chemical process. In the wet chemical process, precursor materials react in an organic solvent to grow crystal particles and the organic solvent or a ligand compound may naturally coordinate to (or be bound to) the surface of the semiconductor nanocrystal, controlling the growth of the crystal.

The organic solvent and the second organic ligand compound may be appropriately selected.

The organic solvent may include a C6 to C22 primary amine such as hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, primary, secondary, or tertiary phosphine substituted with at least one (e.g., 1, 2, or 3) C6 to C22 alkyl group (e.g., trioctylphosphine), for example, phosphine oxide substituted with 1, 2, or 3 C6 to C22 alkyl groups (e.g. trioctylphosphine oxide), a C12 to C22 aromatic ether such as phenyl ether or benzyl ether, or a combination thereof.

The second organic ligand compound may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, or $R_2POOH$ (wherein, R and R' include independently hydrogen, a substituted or unsubstituted C1 to C40 aliphatic hydrocarbon, or a substituted or unsubstituted C6 to C40 aromatic hydrocarbon, or a combination thereof, and in each ligand, at least one R is not hydrogen), which is bound to the surface of the semiconductor nanocrystal. The second organic ligand may include an anion of the second organic ligand compound. For example, when the second organic ligand compound is oleic acid, the second organic ligand may be oleate.

The prepared semiconductor nanocrystal may be recovered by pouring an excess amount of a non-solvent to a reaction solution including the semiconductor nanocrystal in order to remove extra organic substances that are not bound to a surface of the semiconductor nanocrystal and centrifuging the resulting mixture to separate the nanocrystals. Examples of the non-solvent may include acetone, ethanol, methanol, and the like, but are not limited thereto.

The recovered semiconductor nanocrystals may include organic substances (e.g., second organic ligands) bound to the surface and an amount of the organic substances may be greater than or equal to about 20 weight percent (wt %) and less than or equal to about 35 wt % based on a total weight of the semiconductor nanocrystals. For the dispersibility of the semiconductor nanocrystals, a presence of the aforementioned amount of organic substance may be required. However, according to the studies of the present inventors, the aforementioned organic substances have a substantial effect as a barrier to the injection of electrons and holes, resulting in a considerable reduction in luminous efficiency.

Accordingly, the semiconductor nanocrystal includes an anion of an inorganic metal salt bound to the surface of the semiconductor nanocrystal. For example, the anion of the inorganic metal salt may be bound to the semiconductor nanocrystal as the inorganic metal salt itself, or only the anion of the inorganic metal salt may be bound to the semiconductor nanocrystal.

The anion of the inorganic metal salt may be strongly bound to the surface of the semiconductor nanocrystals and passivate the semiconductor nanocrystals instead of (e.g., by replacing) a second organic ligand (e.g., oleate) that may be present on a surface of the original semiconductor nanocrystals. Although not intending to be bound by a specific theory, the semiconductor nanocrystals may include the anion of the inorganic metal salt strongly bound to the surface instead of at least a portion of the second organic ligand, the latter of which can act as an insulator, and such an anion of an inorganic metal salt may improve passivation for semiconductor nanocrystals and improve charge injection characteristics of the semiconductor nanocrystals, and thus, may lower a driving voltage of a device.

The inorganic metal salt may be in the form of an inorganic metal halide, an inorganic metal sulfate, an inorganic metal nitrate, an inorganic metal thiocyanate, or a combination thereof, and the metal of the inorganic metal salt may be zinc (Zn), indium (In), gallium (Ga), magnesium (Mg), lithium (Li), nickel (Ni), tin (Sn), copper (Cu), silver (Ag), cobalt (Co), or a combination thereof.

For example, the inorganic metal salt may include zinc chloride, zinc bromide, zinc iodide, zinc nitrate, zinc sulfate, zinc thiocyanate, indium chloride, indium bromide, indium iodide, indium nitrate, indium sulfate, indium thiocyanate, gallium chloride, gallium bromide, gallium iodide, gallium nitrate, gallium sulfate, gallium thiocyanate, magnesium chloride, magnesium bromide, magnesium iodide, magnesium nitrate, magnesium sulfate, magnesium thiocyanate, lithium chloride, lithium bromide, lithium Iodide, lithium nitrate, lithium sulfate, lithium thiocyanate, nickel chloride, nickel bromide, nickel iodide, nickel nitrate, nickel sulfate, nickel thiocyanate, tin chloride, tin bromide, tin iodide, tin nitrate, tin sulfate, tin thiocyanate, copper chloride, copper bromide, copper iodide, copper nitrate, copper sulfate, copper thiocyanate, silver chloride, silver bromide, silver iodide, silver nitrate, silver sulfate, silver thiocyanate, cobalt chloride, cobalt bromide, cobalt iodide, cobalt nitrate, cobalt sulfate, cobalt thiocyanate, or a combination thereof.

For example, the metal included in the inorganic metal salt may be the same as the metal included in the outermost layer of the semiconductor nanocrystal. The outermost layer of the semiconductor nanocrystal may include zinc, and the inorganic metal salt may be a zinc halide.

As described above, a second organic ligand (e.g., oleate, C18) that may be present on a surface of the semiconductor nanocrystal after synthesis would increase an amount of organic substances in the light-emitting film including the semiconductor nanocrystal and thus, current injection may be hindered due to an inherent insulating characteristic. Therefore, in the semiconductor nanocrystal, the amount of organic substances may be reduced through a substitution of the anion of the inorganic metal salt. However, when the amount of the organic substance is decreased, there must be no reduction in luminous efficiency (photoluminescence quantum yield, PLQY) of the semiconductor nanocrystal, and if an excessive amount of the second organic ligand is replaced, the semiconductor nanocrystal may be precipitated. However, in the case of a complete or near complete substitution with the anion of the inorganic metal salt, the objective of further improving PLQY while reducing the content of the insulating organic substance and simultaneously preventing the semiconductor nanocrystals from being precipitated may not be achieved. In particular, in the case of a blue light emitting device based on a Cd-free ZnSe core, an overall band level may be higher than that of a cadmium-based semiconductor nanocrystal (HOMO: about −5.8 eV, LUMO: about −3.1 eV), and when a metal oxide (e.g., zinc magnesium oxide) is used for the ETL layer (CB (conduction band): about −4.3 eV), the electron block may be too large.

In addition, even if the second organic ligand is replaced by a short organic ligand (e.g., dodecane thiol (DDT) or Zn-dodecane thiol (ZnDDT)) or replaced by the anion of the inorganic metal salt alone, electron transport (ET) characteristics may not be improved.

In the semiconductor nanocrystal according to an embodiment, the second organic ligand on the surface of the semiconductor nanocrystal is replaced by the anion of the inorganic metal salt and the first organic ligand to improve ET, increase PLQY and thermal stability, and improve actual device performance. That is, by coordinating the first organic ligand including an aromatic ring group, an aromatic heterocyclic group, or a combination thereof, which has a conjugated structure capable of transporting electrons or holes, to the surface of the semiconductor nanocrystal, a flow of electrons or holes may be improved.

The first organic ligand includes a substituted or unsubstituted C6 to C30 aromatic ring group and a carboxylate group, a substituted or unsubstituted C3 to C30 aromatic heterocyclic group and a carboxylate group, or a combination thereof.

For example, the first organic ligand may be represented by Chemical Formula 1.

Chemical Formula 1

$$X—L—Ar_1—[Y]_n$$

In Chemical Formula 1, $Ar_1$ may be a substituted or unsubstituted monocyclic aromatic ring group, a substituted or unsubstituted condensed polycyclic aromatic ring group, or a combination thereof joined by a linker, an aromatic ring group including two or more independently substituted or unsubstituted monocyclic aromatic ring groups or two or more independently substituted or unsubstituted condensed polycyclic aromatic ring groups, each of which is joined by a linker.

The linker may be one of a single bond, $—(CR^aR^b)_{n1}—$, —O—, —S—, —Se—, —C(═O)—, —C(═O)O—, —OC(═O)—, —N═, $—SiR^dR^e—$, or $—GeR^fR^g—$, wherein $R^a$ to $R^g$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, $Ar_1$ may be a substituted or unsubstituted C6 to C20 aryl group, or a substituted or unsubstituted C2 to C20 heteroaryl group. For example, $Ar_1$ may include a structural moiety of benzene, biphenyl, naphthalene, anthracene, phenanthrene, pyrene, perylene(peylene), fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopurine, isoquinoline, purine or a combination thereof.

L may be a single bond, a substituted or unsubstituted C1 to C30 alkylene group, or an unsaturated linker of $—CR^a═CR^b—$ or —C≡C— (wherein, $R^a$ and $R^b$ are independently hydrogen, or an optionally substituted C1 to C10 alkyl group).

X may be a carboxylate group bound to the surface of the semiconductor nanocrystal, Y may be a hydroxy group, a halogen group, an amine group, or a nitro group, and n may be an integer of 0 to 6.

For example, the first organic ligand may include benzoate, hydroxyl benzoate, halo-benzoate, amino-benzoate, nitro-benzoate, 4-biphenyl carboxylate, cinnamate acid, or a combination thereof.

The first organic ligand including the aromatic cyclic group or the aromatic heterocyclic group may improve current injection characteristics and life-span of the semiconductor nanocrystal, improve mobility of electrons and holes, and reduce a driving voltage of the device by lowering resistance to charge flow, and thereby, greatly improve efficiency and life-span.

The semiconductor nanocrystal may further include a carboxylate group, or the corresponding carboxylate thereof, bound to the surface of the semiconductor nanocrystal. The carboxylate group may be the second organic ligand present on the surface of the semiconductor nanocrystals. The carboxylate group may include an anion of C6 or more, for example, C8 or more, C12 or more, C15 or more, C16 or more, or C18 or more and C30 or less aliphatic carboxylic acid compounds. The plurality of semiconductor nanocrystals may include a ligand derived from a compound represented by RCOOH (wherein R is an optionally substituted C12 or higher alkyl group or an optionally substituted C12 or higher alkenyl group) in a limited amount.

The second organic ligand may be derived from a second organic ligand compound. Specific examples of the second organic ligand compound may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide pentyl phosphineoxide, tributylphosphine oxide, octylphosphine oxide, dioctyl phosphine oxide, trioctylphosphine oxide; diphenyl phosphine, triphenyl phosphine, an oxide compound thereof; C5 to C20 alkyl C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid, but are not limited thereto.

A weight ratio of the anion of the inorganic metal salt and the first organic ligand may be about 30 to 60:10 to 30, respectively. For example, a weight ratio of the anion of the inorganic metal salt may be about 30:10 to 30, about 35:10 to 30, about 40:10 to 30, about 45:10 to 30, about 50:10 to 30, about 55:10 to 30, or about 60:10 to 30, and for example, a weight ratio of the first organic ligand may be about 30 to 60:10, about 30 to 60:15, about 30 to 60:20, about 30 to 60:25, or about 30 to 60:30.

A weight ratio of the second organic ligand, the anion of the inorganic metal salt, and the first organic ligand may be about 30 to 60:30 to 60:10 to 30, respectively. For example, a weight ratio of the second organic ligand may be about 30:30 to 60:10 to 30, about 35:30 to 60:10 to 30, about 40:30 to 60:10 to 30, about 45:30 to 60:10 to 30, about 50:30 to 60:10 to 30, about 55:30 to 60:10 to 30, or about 60:30 to 60:10 to 30, and for example, a weight ratio of the anion of the inorganic metal salt may be about 30 to 60:30:10 to 30, about 30 to 60:35:10 to 30, about 30 to 60:40:10 to 30, about 30 to 60:45:10 to 30, about 30 to 60:50:10 to 30, about 30 to 60:55:10 to 30, or about 30 to 60:60:10 to 30, and for example, a weight ratio of the first organic ligand may be about 30 to 60:30 to 60:10, about 30 to 60:30 to 60:15, about 30 to 60:30 to 60:20, about 30 to 60:30 to 60:25, or about 30 to 60:30 to 60:30.

FIG. 1 is a schematic view illustrating a semiconductor nanocrystal according to an embodiment. FIG. 1 shows an example of a semiconductor nanocrystal including zinc in the outermost layer, chloride derived from $ZnCl_2$ as the anion of the inorganic metal salt, as benzoate as the first organic ligand, and oleate as the second organic ligand.

Referring to FIG. 1, the anion of the inorganic metal salt and the first organic ligand replace the second organic ligand existing on the surface of the original semiconductor nanocrystal, and bound to $Zn^+$ on the surface of the semiconductor nanocrystal to passivate the semiconductor nanocrystals.

A light-emitting film according to another embodiment includes a plurality of the aforementioned semiconductor nanocrystals.

The light emitting layer may be disposed on a substrate. The light-emitting film may contact the substrate. The substrate may include a hole auxiliary layer (e.g., a hole injection layer, a hole transport layer, or a combination thereof) or an electron auxiliary layer (e.g., an electron injection layer, an electron transport layer, or a combination thereof) in a light emitting device that will be described later. The substrate may be a light-transmitting or transparent substrate.

A thickness of the light-emitting film may be greater than or equal to about 5 nm, for example, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm. The light emitting layer may include two or more, for example, three or more, or four or more monolayers of semiconductor nanocrystals. The thickness of the light-emitting film may be less than or equal to 100 nm, for example, less than or equal to 90 nm, less than or equal to 80 nm, less than or equal to 70 nm, less than or equal to 60 nm, less than or equal to 50 nm, or less than or equal to about 40 nm. The light-emitting film according to an embodiment may exhibit improved charge injection characteristics and thus, may have a relatively increased thickness.

Another embodiment provides a method of producing the aforementioned light-emitting film. The method includes disposing a film including a plurality of semiconductor nanocrystals on a substrate, and treating the plurality of semiconductor nanocrystals with a solution including an inorganic metal salt in a polar solvent to bind an anion of the inorganic metal salt to the plurality of semiconductor nanocrystals, and treating the plurality of semiconductor nanocrystals with a solution including a first organic ligand to bind the first organic ligand to the plurality of semiconductor nanocrystals.

The semiconductor nanocrystal, the anion of the inorganic metal salt, the first organic ligand, the substrate, and the like are the same as described above.

The bonding of the anion of the inorganic metal salt and/or the first organic ligand to the plurality of semiconductor nanocrystals may be performed before or after the formation of the film.

Before treatment with the solution, the plurality of semiconductor nanocrystals may include native ligands on the surface. The native ligand may include the second organic ligand (e.g., a carboxylate) described above.

A method of disposing the plurality of semiconductor nanocrystals on a substrate is not particularly limited and may be appropriately selected. The disposing method may include spin coating, contact printing, or a combination thereof. The specific disposing manner may be appropriately selected. The method may further include washing the treated film at least once with a polar solvent that does not include the inorganic metal salt. In the washing, the inorganic metal salts not bound to the plurality of semiconductor nanocrystals may be removed.

The disposed (and, optionally washed) light-emitting film may be heat-treated at a temperature of greater than or equal to about 50° C., for example, greater than or equal to about 60° C., greater than or equal to about 70° C., or greater than or equal to about 75° C. and less than or equal to about 150° C., for example less than or equal to about 120° C., or less than or equal to about 100° C. for about 1 minute or more, for example about 2 minutes or more, about 3 minutes or more, about 4 minutes or more, about 5 minutes or more, about 10 minutes or more, about 15 minutes or more, or about 20 minutes or more and about 1 or less.

The polar solvent may include an alcohol having a C1 to C10 linear or branched chain hydrocarbon group, or a combination thereof. For example, the polar solvent may include methanol, ethanol, propanol, isopropanol, butanol, pentanol, hexanol, heptanol, or a combination thereof.

The treatment may include contacting the solution with the film. The contacting may include, but is not limited to, spraying, dipping, or a combination thereof.

Another embodiment provides a light emitting device including the aforementioned light-emitting film.

In the light emitting device, the light-emitting film is disposed between two electrodes each having a surface opposite the other, for example, a first electrode and a second electrode (or an anode and a cathode).

Figure 2:
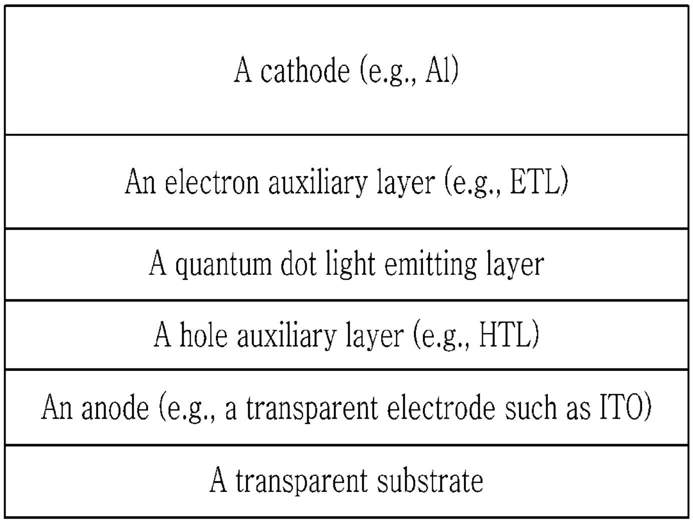
FIG. 2 is a schematic cross-sectional representation of an example of a light emitting device according to another embodiment.

For example, at least one of the anode and the cathode may include a metal oxide-based transparent electrode (e.g., ITO). At least one of the anode and the cathode may include a metal (e.g., Mg, Al, etc.) having a predetermined (e.g., relatively low) work function. For example, TFB and/or PVK as a hole transport layer and/or PEDOT:PSS and/or p-type metal oxide as a hole injection (transport) layer may be disposed between the electrode and the light-emitting film. In addition, an electron auxiliary layer (e.g., an electron transport layer, etc.) may be disposed between the light-emitting film and the cathode (see FIG. 2).

Figure 3:
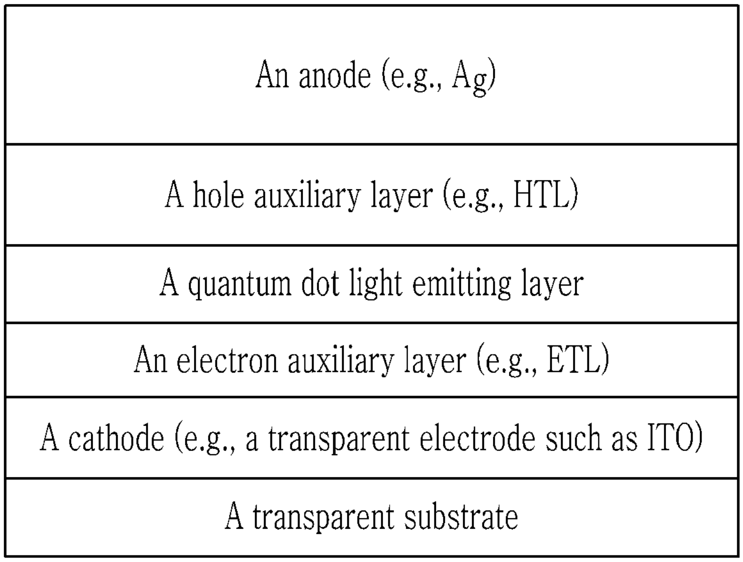
FIG. 3 is a schematic cross-sectional representation of another example of a light emitting device according to another embodiment.

In another embodiment, the light emitting device may have an inverted structure. Herein, a cathode disposed on a transparent substrate may include a metal oxide-based transparent electrode (e.g., ITO, FTO, etc.) and the anode may include a metal (e.g., Au, Ag, etc.) having a predetermined (e.g., a relatively high) work function. For example, an n-type metal oxide (ZnO) or the like may be disposed between the cathode and the light-emitting film as an electron auxiliary layer (e.g., an electron transport layer). A hole auxiliary layer (e.g., a hole transport layer including TFB and/or PVK and/or a hole injection layer including $MoO_3$ or other p-type metal oxide) may be disposed between the metal anode and the semiconductor nanocrystal light-emitting film, (see FIG. 3).

Figure 4:
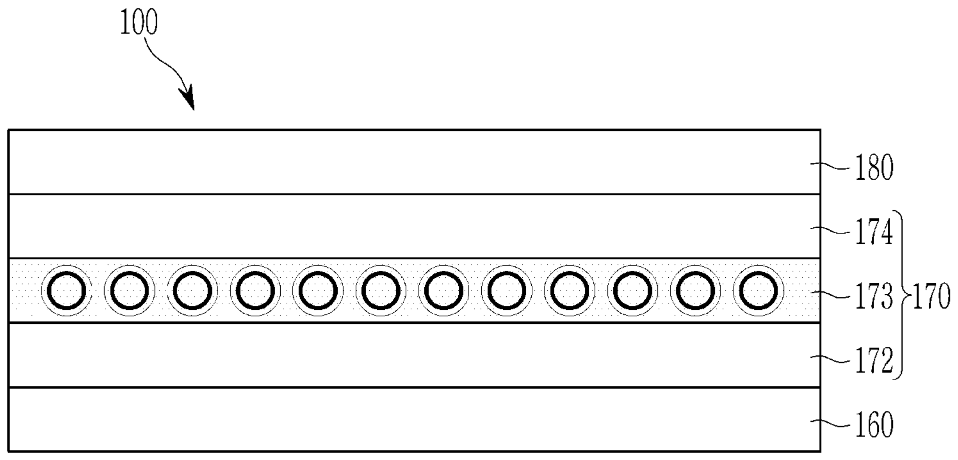
FIG. 4 is a schematic cross-sectional representation of another example of a light emitting device according to another embodiment.

Hereinafter, the light emitting device and the display device including the same are described in detail with reference to FIGS. 4 and 5. FIG. 4 is a cross-sectional representation of a light emitting device according to an embodiment, and FIG. 5 is a cross-sectional representation illustrating a display device according to an embodiment.

Figure 5:
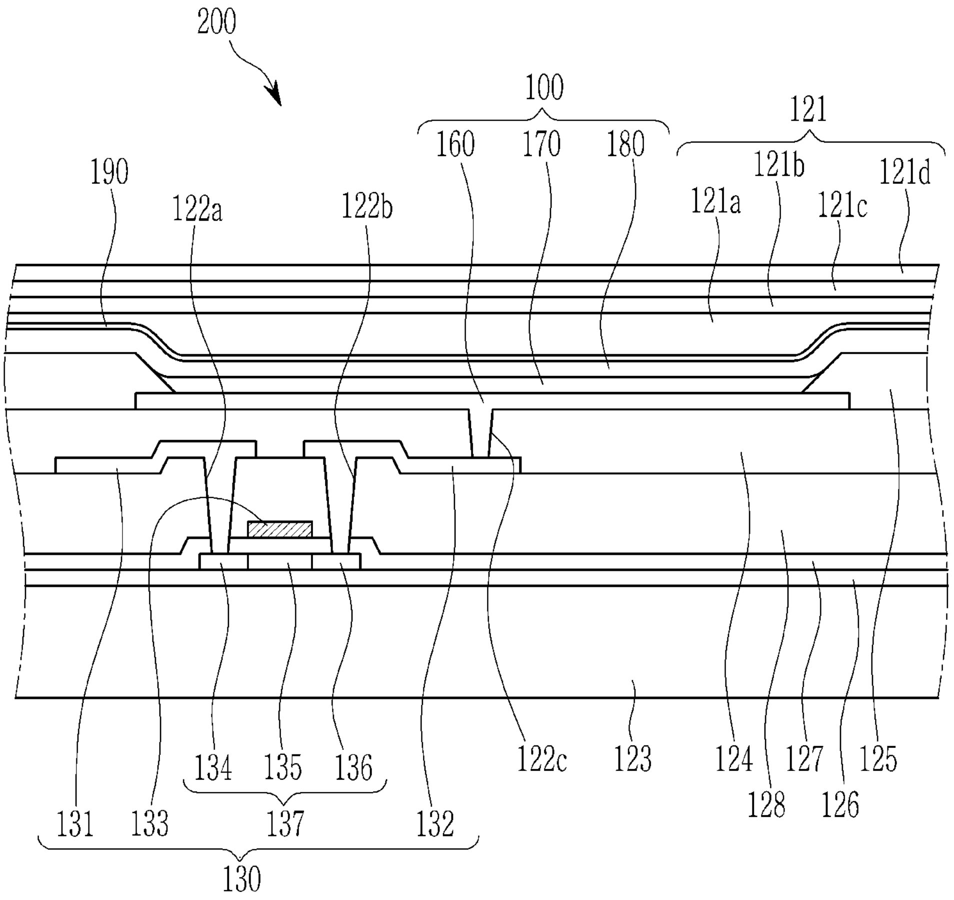
FIG. 5 is a cross-sectional representation illustrating a display device according to another embodiment.

Although a structure of the display device 200 shown in FIG. 5 is described as a driving thin film transistor and a light emitting device, the structure of the display device 200 may include a switching thin film transistor, a signal line, and the like.

Referring to FIG. 4, a light emitting device 100 according to a non-limiting embodiment has a structure in which a first electrode 160, a hole auxiliary layer 172, a light emitting layer 173, an electron auxiliary (e.g., transport) layer 174, and a second electrode 180 are stacked in the order indicated. The light emitting device layer 170 of FIG. 4, which will be described later, includes a hole auxiliary layer 172, a light emitting layer 173, and an electron transport layer 174.

When the first electrode 160 is an anode, it may include a material having a high work function so that holes may be easily injected.

The first electrode 160 according to a non-limiting embodiment may be a transparent electrode and may be formed to have a thin thickness using a conductive oxide such as indium tin oxide (ITO), indium zinc oxide (IZO), zinc tin oxide (ZTO), copper indium oxide (ClO), copper zinc oxide (CZO), gallium zinc oxide (GZO), aluminum zinc oxide (AZO), tin oxide ($SnO_2$), zinc oxide (ZnO), or a combination thereof, a metal such as calcium (Ca), ytterbium (Yb), aluminum (Al), silver (Ag), or magnesium (Mg), conductive carbon such as graphene or carbon nanotube, or a conductive polymer such as PEDOT:PSS.

In addition, the first electrode 160 is not limited thereto and may be formed in a stacked structure of two or more layers.

The hole auxiliary layer 172 may be disposed between the first electrode 160 and the light emitting layer 173. Herein, the hole auxiliary layer 172 may be a hole injecting layer that facilitates injection of holes and/or a hole transport layer that facilitates transport of holes from the first electrode 160 to the light emitting layer 173.

In addition, the hole auxiliary layer 172 may further include an electron blocking layer that blocks transport of electrons, a hole blocking layer that blocks transport of holes, or a combination thereof.

The hole transport layer and/or the hole injecting layer may include, for example at least one selected from poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1bis[(di-4-tolylamino)phenylcyclohexane (TAPC), and a combination thereof, but are not limited thereto.

The hole blocking layer may include, for example, at least one selected from 1,4,5,8-naphthalene-tetracarboxylic dianhydride (NTCDA), basocuproin (BCP), tris[3-(3-pyridyl)-mesityl]borane (3TPYMB), LiF, Alq3, Gaq3, Inq3, Znq2, Zn(BTZ)2, BeBq2, and a combination thereof, but is not limited thereto.

On the other hand, in FIG. 4, the hole auxiliary layer 172 is formed as a single layer. However, the present disclosure is not limited thereto and the hole auxiliary layer 172 may be formed of a plurality of layers including two or more layers.

Although not intending to be bound by a specific theory, when the light-emitting film according to an embodiment is employed as the light emitting layer 173, hole injection may be improved to provide an improved balance between electrons and holes to be combined, and stability and luminous properties of the light emitting device 100 may be increased.

Next, the light emitting layer 173 is disposed on the hole auxiliary layer 172. The light emitting layer 173 includes the semiconductor nanocrystal. For example, the light emitting layer 173 may display primary colors such as blue, green, or red, or combined colors thereof. The light emitting layer 173 may be formed by coating dispersion in which the semiconductor nanocrystals are dispersed in a solvent using a method of a spin coating, an inkjet or spray coating, and the like, and then drying the resultant. The light emitting layer 173 may be formed to have a thickness of greater than or equal to about 5 nm, for example, about 10 nm to about 100 nm, for example about 10 nm to about 50 nm or about 15 nm to about 30 nm.

An electron auxiliary layer 174 may be disposed on the light emitting layer 173. The electron auxiliary layer 174 may be disposed between the second electrode 180 and the light emitting layer 173. The electron auxiliary layer 174 may be an electron injection layer that facilitates injection of electrons from the second electrode 180 to the light emitting layer 173 and/or an electron transport layer that facilitates transport of electrons.

The electron auxiliary layer 174 may also include a hole blocking layer that blocks transport of holes.

The electron transport layer and/or electron injection layer may include, for example at least one selected from 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, and a combination thereof, but is not limited thereto.

For example, the electron auxiliary layer 174 (e.g., an electron transport layer) may include a plurality of nanoparticles. The nanoparticles may include a metal oxide including zinc.

As described above, when a metal oxide (e.g., zinc magnesium oxide) is used for the electron auxiliary layer 174, the electron block may become more severe. By configuring the light emitting layer 173 with the semiconductor nanocrystal, improvement of PLQY and thermal stability may be maximized while improving ET and improving the actual device performance.

The metal oxide may be represented by Chemical Formula 2.

$Zn_{1-x}M_xO$ Chemical Formula 2

In Chemical Formula 2, M is Mg, Ca, Zr, W, Li, Ti, or a combination thereof and $0 \leq x \leq 0.5$. For example, in Chemical Formula 2, M may be magnesium (Mg). For example, in Chemical Formula 2, the x may be about 0 or more and about 0.5 or less, for example about 0.01 or more and about 0.3 or less, about 0.25 or less, about 0.2 or less, or about 0.15 or less.

The metal oxide may include zinc oxide, zinc magnesium oxide, or a combination thereof. An absolute value of LUMO of the semiconductor nanocrystal included in the light emitting layer 173 may be less than an absolute value of LUMO of the metal oxide. For example, the absolute value of LUMO of the semiconductor nanocrystal may be greater than the absolute value of LUMO of the metal oxide ETL. The blue QD may have an absolute value of LUMO that is less than an absolute value of LUMO of the metal oxide ETL. The electron injection in the electroluminescent device including the blue QD may be different from that of the light emitting device including red or green semiconductor nanocrystals.

The nanoparticle may have a size of greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticle may not have a rod shape. The nanoparticle may not have a nanowire shape.

As depicted in FIG. 4, the electron auxiliary layer 174 is formed as a single layer. However, the present disclosure is not limited thereto and the electron auxiliary layer 174 may be formed of a plurality of layers including two or more layers.

A second electrode 180 is disposed on the electron auxiliary layer 174. In the light emitting device 100 according to an embodiment, the first electrode 160 may be an anode and the second electrode 180 may be a cathode. However, it is not limited thereto, and the first electrode 160 may be a cathode and the second electrode 180 may be an anode.

The second electrode 180 may be a transparent electrode, and may be formed to have a thin thickness using a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as calcium (Ca), ytterbium (Yb), aluminum (Al), silver (Ag), magnesium (Mg) and a metal alloy, conductive carbon such as graphene or carbon nanotube, or a conductive polymer such as PEDOT:PSS.

Hereinafter, a display device 200 including the aforementioned light emitting device 100 will be described referring to FIG. 5.

Referring to FIG. 5, a buffer layer 126 may be disposed on a substrate 123. The buffer layer 126 prevents penetration of impurities and may flatten the surface of the substrate 123.

The semiconductor layer 137 is disposed on the buffer layer 126. The semiconductor layer 137 is formed of a polysilicon film.

The semiconductor layer 137 includes a channel region 135 that is not doped with an impurity, a source region 134 and a drain region 136 that are disposed on both sides of the channel region 135, and each of the source region 134 and drain region 136 may be doped. Herein, the doped ion impurity may vary depending on a type of thin film transistor.

The gate insulating film 127 is disposed on the semiconductor layer 137 and a gate line including a gate electrode 133 is disposed on the gate insulating film 127. Herein, the gate electrode 133 overlaps with a part of the semiconductor layer 137, particularly, the channel region 135.

An interlayer insulating layer 128 is disposed between the gate insulating layer 127 and the gate electrode 133. The gate insulating layer 127 and the interlayer insulating layer 128 have a first contact hole 122*a* and a second contact hole 122*b* overlapping the source region 134 and the drain region 136, respectively, of the semiconductor layer 137.

A data line including the source electrode 131 and the drain electrode 132 is disposed on the interlayer insulating layer 128.

The source electrode 131 and the drain electrode 132 are respectively electrically connected to the source region 134 and the drain region 136 of the semiconductor layer 137 through the first contact hole 122*a* and the second contact hole 122*b* formed in the interlayer insulating layer 128 and the gate insulating layer 127.

The aforementioned semiconductor layer 137, the gate electrode 133, the source electrode 131 the drain electrode 132 constitute the thin film transistor 130. The structure of the thin film transistor 130 is not limited to the aforementioned embodiment and may be variously changed into a known configuration that may be easily carried out by a person skilled in the art.

Next, the planarization layer 124 is disposed on the interlayer insulating layer 128 and the data line. The planarization layer 124 serves to remove a step in order to increase luminous efficiency of the light emitting device 100 disposed thereon.

The planarization layer 124 may have a third contact hole 122*c* overlapping with the drain electrode 132.

Herein, an embodiment is not limited to the aforementioned structure, and in some embodiments, either of the planarization layer 124 and the interlayer insulating layer 128 may be omitted as needed.

Next, the first electrode 160 included in the light emitting device 100 is disposed on the planarization layer 124. The first electrode 160 may be a pixel electrode. The first electrode 160 is connected to the drain electrode 132 through the third contact hole 122*c* of the planarization layer 124.

A pixel defining layer 125 having an opening overlapping with the first electrode 160 is disposed on the planarization layer 124. The light emitting device layer 170 may be disposed for each opening of the pixel defining layer 125. That is, the pixel defining layer 125 may define a pixel area where each light emitting device layer 170 is disposed.

The light emitting device layer 170 is disposed on the first electrode 160. The light emitting device layer 170 may include a hole auxiliary layer 172, a light emitting layer 173, and an electron auxiliary layer 174, as described with reference to FIG. 4, which are the same as the aforementioned constituent elements, and thus descriptions thereof will be omitted.

The second electrode 180 is disposed on the light emitting device layer 170. The second electrode 180 may be a common electrode. Such the first electrode 160, the light emitting device layer 170, and the second electrode 180 constitute the light emitting device 100.

The first electrode 160 and the second electrode 180 may be formed of a transparent conductive material or a semi-transmissive or reflective conductive material, respectively. Depending on types of materials forming the first electrode 160 and the second electrode 180, the display device 200 may be a top emission type, a bottom emission type, or a both-sided emission type.

An overcoat 190 protecting the second electrode 180 is disposed on the second electrode 180.

Then, the thin film encapsulation layer 121 is disposed on the overcoat 190. The thin film encapsulation layer 121 protects the light emitting device 100 and the circuit portion (not shown) disposed on the substrate 123 from the outside by sealing them.

The thin film encapsulation layer 121 includes organic encapsulation films 121*a* and 121*c* and inorganic encapsulation films 121*b* and 121*d* which are alternately stacked one by one. FIG. 5 illustrate a case where the for example two organic encapsulation films 121*a* and 121*c* and the two inorganic organic encapsulation films 121*b* and 121*d* are alternately stacked one by one to form the thin film encapsulation layer 121. However, the configuration of the thin film encapsulation layer 121 is not limited thereto, and may be altered in various manners as needed.

Hereinafter, specific examples of the present disclosure will be described. It should be noted, however, that these examples described below are only intended to illustrate or explain the present disclosure in detail, and the scope of the invention should not be limited thereby.

Analysis Methods (1) ET (Electron Transport) Analysis

ET (electron transport) properties are evaluated using a CS-2000 (Mcscience Inc.), which measures voltage-current-luminescence properties of QD-LED and OLED.

(2) Photoluminescence Analysis

A Hitachi F-7000 spectrometer is used to obtain a photoluminescence (PL) spectrum of nanocrystals at an irradiation wavelength of 372 nm.

(3) Analysis of Hole and Electron Transport Capability

Hole and electron transport capability is evaluated by measuring a current depending on a voltage with a Keithley 2635B source meter attached to CS-2000 with an applied voltage.

Preparation Example 1: Preparation of Semiconductor Nanocrystal

Preparation Example 1-1: Preparation of Semiconductor Nanocrystals Including Oleate Ligand (hereinafter, also referred to as "OA-QD")

(1) Preparation of ZnTeSe Core

Selenium and tellurium are dispersed in trioctylphosphine (TOP) to obtain a 2 M Se/TOP stock solution and a 2 M Te/TOP stock solution. A trioctylamine solution including 0.125 millimoles (mmol) of zinc acetate and 0.25 mmol of palmitic acid is prepared in a 400 milliliters (mL) reaction flask. The solution is heated at 120° C. under vacuum for 1 hour, then nitrogen gas is added to the reaction flask, and the reaction flask is heated to 300° C. The prepared Se/TOP stock solution and Te/TOP stock solution are rapidly added to the reaction flask, and the obtained mixture is reacted for 1 hour at 300° C. When the reaction is complete, the reaction solution is cooled to room temperature, acetone is added to the flask, and resulting precipitate is separated with a centrifuge and dispersed in toluene.

(2) Preparation of Blue Light Emitting ZnTeSe/ZnSeS Core/Shell Semiconductor Nanocrystal 0.9 mmol of zinc acetate, 1.8 mmol of oleic acid, and 10 mL of trioctylamine are added to a reaction flask and heated at 120° C. under vacuum for 10 minutes. Nitrogen gas is added to the reaction flask and the flask is heated to 280° C. Subsequently, the prepared toluene dispersion of a ZnTeSe core (OD, optical density of $1^{st}$ excitonic absorption, OD=0.45) is added to the reaction flask within 10 seconds followed by the addition of 0.6 mmol of Se/TOP and 2.0 mmol of S/TOP, and the mixture is reacted for 120 minutes at 280° C. to prepare a (crude) reaction solution. When the reaction is complete, the reaction solution is rapidly cooled to room temperature (24° C.), ethanol is added, and the resulting precipitate is separated with a centrifuge and re-dispersed in cyclohexane to prepare a ZnSe/ZnSeS semiconductor nanocrystal. The produced semiconductor nanocrystal exhibits a photoluminescent spectrum with a PL emission peak of about 450 nm and photoluminescent quantum yield (PLQY) of 60%.

Preparation Example 1-2: Preparation of Semiconductor Nanocrystal Including Chloride Ligand (hereinafter, also Referred to as "CI-QD")

Zinc chloride is dissolved in ethanol to obtain a zinc chloride solution at a concentration of 10 wt %. 0.01 mL of the zinc chloride solution is added to the organic dispersion of the Blue Light Emitting ZnTeSe/ZnSeS Core/Shell semiconductor nanocrystals and stirred at 60° C. for 30 minutes to achieve a surface exchange reaction. After the reaction, ethanol is added to the mixture to induce precipitation, and the precipitate is separated with a centrifuge to obtain semiconductor nanocrystals. The semiconductor nanocrystals are then treated by repeating the same surface exchange reaction with the $ZnCl_2$ solution to obtain semiconductor nanocrystals including chloride ligands.

Preparation Example 1-3: Preparation of Semiconductor Nanocrystal Including Benzoate Ligand (hereinafter, also Referred to as "BzA-QD")

0.01 mL of a benzoic acid-containing solution (a concentration: 10 wt %) is added to the cyclohexane dispersion of Blue Light Emitting ZnTeSe/ZnSeS Core/Shell semiconductor nanocrystal and stirred at 60° C. for 30 minutes to achieve a surface exchange reaction. After the reaction, ethanol is added to induce precipitation, and the precipitate is separated with a centrifuge to obtain semiconductor nanocrystals. The semiconductor nanocrystals are then treated by repeating the same surface exchange reaction with the benzoic acid solution to obtain semiconductor nanocrystals including benzoate ligands.

Preparation Example 1-4: Preparation of Semiconductor Nanocrystal Including Chloride and Benzoate (hereinafter, also Referred to as "BzA/CI-QD")

The semiconductor nanocrystals including chloride ligands of Preparation Example 1-2 are dispersed in toluene to obtain semiconductor nanocrystal organic dispersion. 0.01 mL of a benzoic acid-containing solution (a concentration: 10 wt %) is added to the semiconductor nanocrystal organic dispersion and stirred at 60° C. for 30 minutes to achieve a surface exchange reaction. After the reaction, ethanol is added to induce precipitation, and the precipitate is separated with a centrifuge to obtain semiconductor nanocrystals. The semiconductor nanocrystals are then treated by repeating the same surface exchange reaction with the benzoic acid solution to obtain semiconductor nanocrystals including chloride ligands and benzoate ligands.

Preparation Example 2: Preparation of Light-Emitting Films

Preparation Example 2-1: Preparation of Light-Emitting Film 0.2 mL of the semiconductor nanocrystal dispersion according to Preparation Example 1 is spin-coated on a glass substrate to form films. The films are heat-treated at 80° C. for 30 minutes to obtain light-emitting films.

Preparation Example 2-2: Preparation of Spin-Dry Treated Light-Emitting Film (SPD)

0.2 mL of each semiconductor nanocrystal dispersion prepared in Preparation Example 1 is spin-coated on a glass substrate to form films. The films are heat-treated at 80° C. for 30 minutes to obtain light-emitting films.

An ethanol solution of zinc chloride (a concentration: 10 mg/mL) is added on the films in a dropwise fashion and reacted for 1 minute to obtain $ZnCl_2$-treated films. The treated films are five times washed with ethanol. The washed films are heat-treated at 80° C. for 30 minutes to obtain spin-dry (SPD) treated light-emitting films.

Preparation Example 3: Preparation of Light Emitting Device

A light-emitting device having a stacking structure of ITO/PEDOT:PSS (30 nm)/TFB (25 nm)/QD light emitting layer (20 nm)/ZnMgO (20 nm)/Al (1000 nm) is manufactured as follows.

(1) After a glass substrate deposited with ITO is surface-treated with UV-ozone for 15 minutes, a PEDOT:PSS solution (H.C. Stark Inc.) is spin-coated and heat-treated at 150° C. under an air atmosphere for 10 minutes and then, at 150° C. under an $N_2$ atmosphere for 10 minutes to form a 30 nm thick hole injection layer (HIL). On the hole injection layer (HIL), a poly[(9,9-dioctylfluorenyl-2,7-diyl-co(4,4'-(N-4-butylphenyl)diphenylamine] solution (TFB) (Sumitomo Corp.) is spin-coated at 150° C. for 30 minutes and then, heat-treated to form a hole transport layer (HTL).

(2) on the hole transport layer (HTL), as in the method of Preparation Example 2-1, the core shell semiconductor nanocrystals according to Preparation Example 1 are spin-coated and heat-treated at 80° C. for 30 minutes to form a light emitting layer on the hole transport layer.

Optionally, as in the method of Preparation Example 2-2, the core-shell semiconductor nanocrystal according to Preparation Example 1 are spin-coated on the hole transport layer (HTL) and heat-treated at 80° C. for 30 minutes to form a semiconductor nanocrystal layer, and then zinc chloride is dissolved in ethanol to prepare a treatment solution (a concentration: 0.1 g/mL), the treatment solution is added on the semiconductor nanocrystal layer in a dropwise fashion, and allowed to stand and removed. The semiconductor nanocrystal layer is washed several times with ethanol, and the layered structure is dried by positioning on an 80° C. hot plate to obtain a SPD-treated light emitting layer.

(3) A solution of ZnMgO nanoparticles (a solvent: ethanol, optical density: 0.5 a.u) is prepared. This solution is spin-coated on the light emitting layer and then, heat-treated at 80° C. for 30 minutes to form an electron auxiliary layer. A second electrode is formed by vacuum-depositing aluminum (Al) on a part of the surface of the electron auxiliary layer to manufacture a light emitting device, as shown in FIG. 4.

EXPERIMENTAL EXAMPLES

Experimental Example 1: Evaluation of ET (Electron Transport) Characteristics In the semiconductor nanocrystals prepared in Preparation Example 1-1, after substituting dodecane thiol (DDT) or Zn-dodecane thiol (ZnDDT) with the oleate, wherein DDT or ZnDDT is a shorter organic ligand than the oleate, ET (electron transport) characteristics of the semiconductor nanocrystals are measured, and the results are shown in Table 1.

TABLE 1

| | ZnMgO (resin aging, D + 7) ET @ 8 V | ZnMgO (no resin) ET @ 8 V | OETL ET @ 8 V |
|---|---|---|---|
| OA | 15.6086 | 1.349 | 4.30748 |
| DDT[1)] | 15.3538 | 3.374 | 2.62573 |
| ZnDDT[2)] | 3.47038 | 1.218 | 2.44568 |

[1)]dodecane thiol
[2)]Zn-dodecane thiol

Referring to Table 1, even though the ligand OA (oleate, C18) is replaced in-part with a second organic ligand having a shorter organic ligand than OA, thereby reducing the amount of OA coordinated to the semiconductor nanocrystal, the ET (electron transport) characteristics are not improved.

In addition, hole and electron transport capability of a light-emitting film (hereinafter, marked as 'CI-QD') formed by using the halogen-treated semiconductor nanocrystals prepared in Preparation Example 1-2 and in accordance with the method of Preparation Example 2-1, and a spin-dried light-emitting film (hereinafter, marked as 'SPD-QD') formed by using the semiconductor nanocrystals prepared in Preparation Example 1-1 and in accordance with the method of Preparation Example 2-2 is respectively measured, and the results are shown in Tables 2 and 3 and FIGS. 6 and 7.

TABLE 2

| HOD HT (3rd sweep J, | 20 nm thick, single light emitting film | |
|---|---|---|
| $mA/cm^2$) | CI-QD | SPD-QD |
| 5 V | 0.036 | 0.242 |
| 8 V | 0.395 | 2.118 |
| 12 V | 24.14 | 101.50 |

TABLE 3

| EOD HT (3rd sweep J, | 20 nm thick, single light emitting film | |
|---|---|---|
| $mA/cm^2$) | CI-QD | SPD-QD |
| 5 V | 220.2 | 283.8 |
| 8 V | 411.6 | 520.0 |
| 12 V | 874.4 | 1221.3 |

Figure 6:
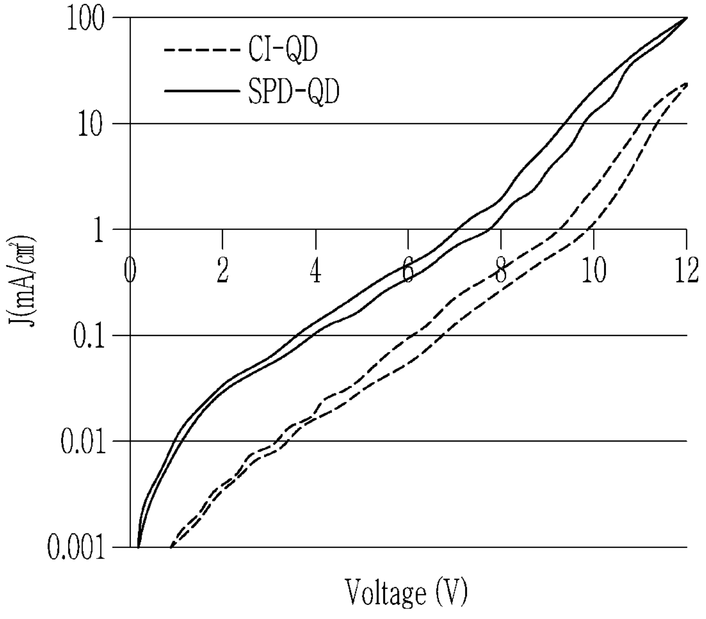
FIGS. 6 and 7 are plots showing results of evaluating electron transport (ET) characteristics of Experimental Example 1.
Figure 7:
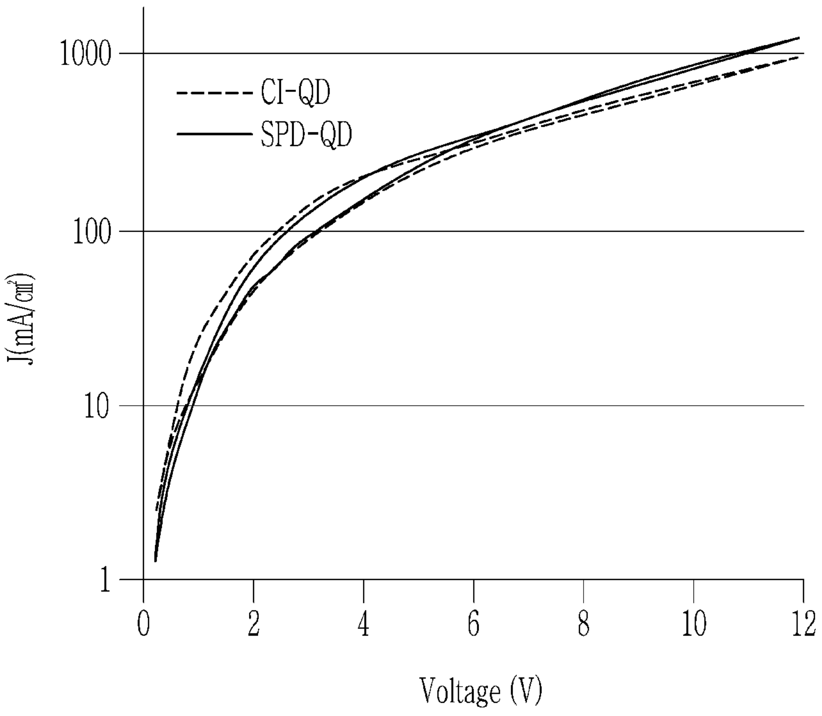

Referring to Tables 2 and 3 and FIGS. 6 and 7, the OA-QD organic substance is removed through the spin-dry treatment of the inorganic metal salt, and accordingly, hole conduction characteristics are improved, but electron conduction characteristics show little or no improvement as OA-QD and CI-QD have almost similar ET (electron transport) characteristics.

Experimental Example 2: Evaluation of Photoluminescence of Light-Emitting Film The semiconductor nanocrystals respectively prepared according to Preparation Examples 1-2, 1-3, and 1-4 are used to form light-emitting films in accordance with the method of Preparation Example 2-1 to evaluate PL characteristics, and the results are shown in Table 4 and FIGS. 8 and 9.

Figure 8:
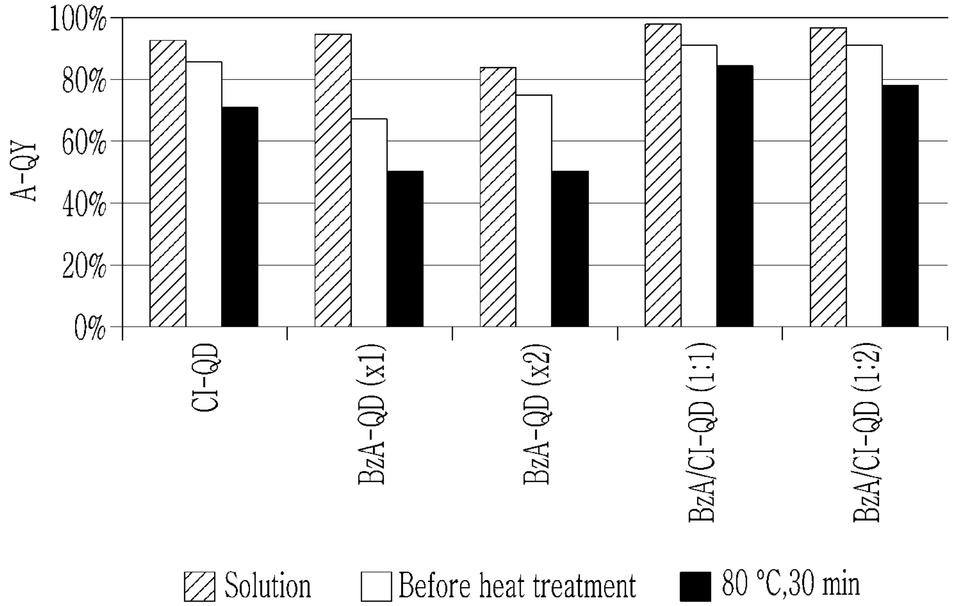
FIGS. 8 and 9 are bar graphs showing results of photoluminescence evaluation of the light-emitting films of Experimental Example 2.
Figure 9:
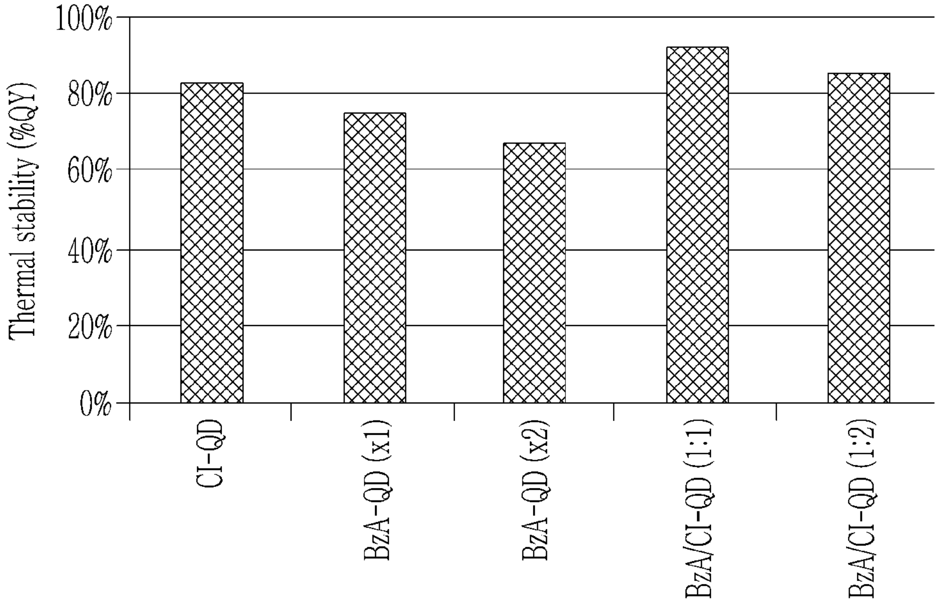

In Table 4 and FIGS. 8 and 9: BzA-QD×2, refers to twice as much BzA is added as BzA-QD(×1), BzA/CI-QD (BzA:$ZnCl_2$=1:1), refers to BzA and $ZnCl_2$ added in a weight ratio of 1:1; and BzA/CI-QD (BzA:$ZnCl_2$=2:1), refers to BzA and $ZnCl_2$ added in a weight ratio of 2:1.

TABLE 4

| QD | | Process | Abs. (%) | A-QY[1] (%) | % QY |
|---|---|---|---|---|---|
| Preparation Example 1-2 | CI-QD | Before heat treatment | 9.0 | 85.9 | 100 |
| | | 80° C., 30 min | 9.7 | 71.4 | 83 |

TABLE 4-continued

| QD | | Process | Abs. (%) | A-QY[1] (%) | % QY |
|---|---|---|---|---|---|
| Preparation Example 1-3 | BzA-QD (×1) | Before heat treatment | 7.2 | 67.6 | 100 |
| | | 80° C., 30 min | 7.7 | 51.1 | 76 |
| | BzA-QD (×2) | Before heat treatment | 7.4 | 75.2 | 100 |
| | | 80° C., 30 min | 8.1 | 50.8 | 68 |
| Preparation Example 1-4 | BzA/CI-QD (BzA:$ZnCl_2$ = 1:1) | Before heat treatment | 13. | 91.0 | 100 |
| | | 80° C., 30 min | 13.8 | 84.7 | 93 |
| | BzA/CI-QD (BzA:$ZnCl_2$ = 2:1) | Before heat treatment | 10.3 | 91.3 | 100 |
| | | 80° C., 30 min | 11.5 | 78.4 | 86 |

[1]A-QY (%): Absolute quantum yield (%)

Referring to Table 4, FIGS. 8 and 9, BzA-QD (Preparation Example 1-3) exhibits a lower PLQY compared to CI-QD (Preparation Example 1-2). However, BzA/CI-QD (Preparation Example 1-4) exhibits significantly higher PLQY as well as excellent thermal stability, both prior to and after the heat treatment of the thin films.

Experimental Example 3: Evaluation of Hole and Electron Transport Capability of Light Emitting Device The semiconductor nanocrystals in Preparation Example 1-1 (OA-QD), Preparation Example 1-2 (CI-QD), Preparation Example 1-3 (BzA-QD), and Preparation Example 1-4 (BzA/CI-QD) are respectively used to manufacture light emitting devices in accordance with the method of Preparation Example 3. Hole and electron transport properties of each is evaluated, and the results are shown in Tables 5 and 6 and FIGS. 10 and 11.

TABLE 5

| HOD, 3rd sweep ($mA/cm^2$) | CI-QD | BzA-QD | BzA/CI-QD (BzA:$ZnCl_2$ = 1:1) |
|---|---|---|---|
| @5 V | 0.01 | 0.01 | 0.03 |
| @8 V | 0.04 | 0.13 | 0.13 |
| @12 V | 1.66 | 1.76 | 2.32 |

TABLE 6

| EOD, 3rd sweep ($mA/cm^2$) | OA-QD | CI-QD | BzA/CI-QD (BzA:$ZnCl_2$ = 1:1) |
|---|---|---|---|
| @5 V | 0.26 | 0.18 | 5.11 |
| @8 V | 1.88 | 0.79 | 31.22 |
| @12 V | 12.58 | 4.99 | 183.2 |

Figure 10:
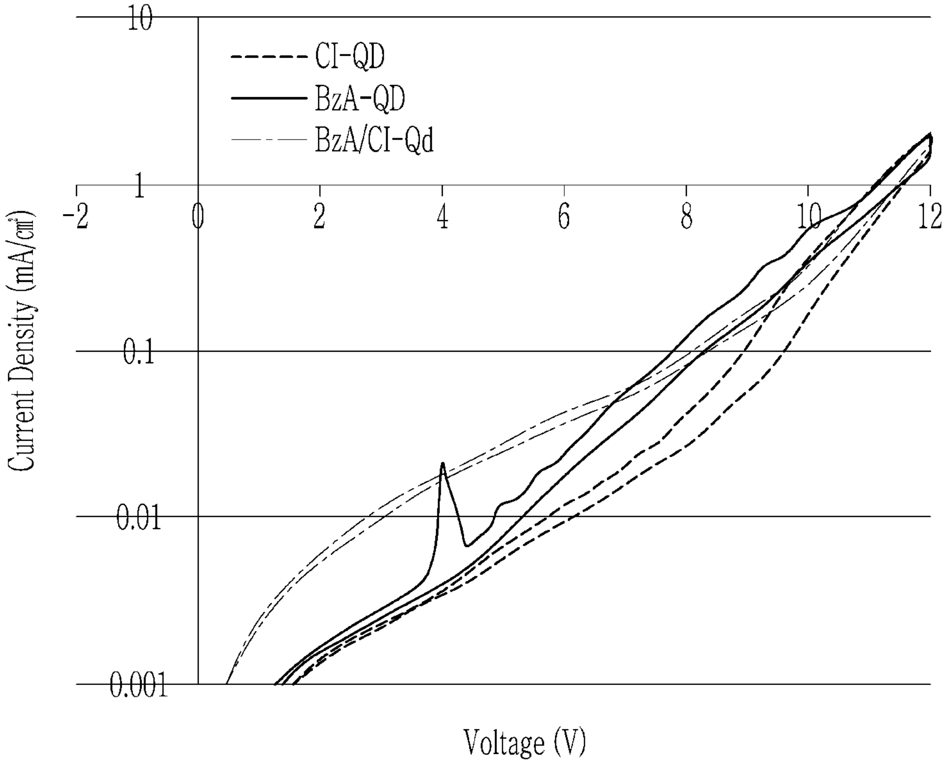
FIGS. 10 and 11 are plots showing results of evaluating hole and electron transport capability of the light emitting device of Experimental Example 3.
Figure 11:
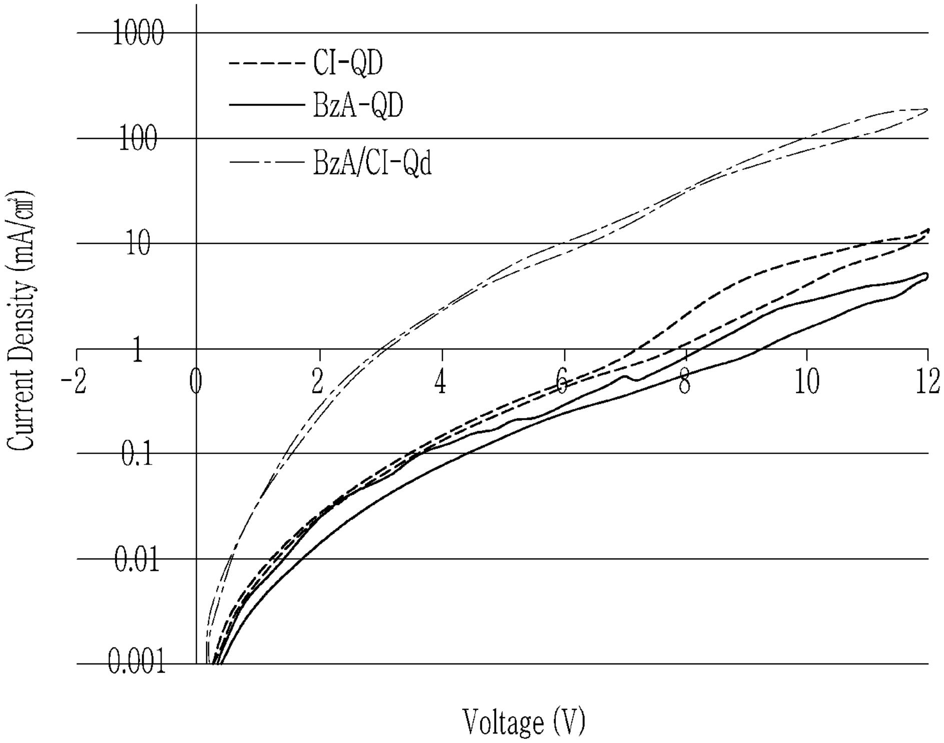

Referring to Tables 5 and 6 and FIGS. 10, and 11, BzA/CI-QD exhibits a significant increase in ET current compared with OA-QD or CI-QD, and the HT characteristics of BzA/CI-QD also about equal to those of CI-QD.

Experimental Example 4: Performance Evaluation 1 of Light Emitting Devices

A light emitting device manufactured by using the semiconductor nanocrystals of Preparation Example 1-1 (hereinafter, marked as 'OA-QD'), a light emitting device manufactured by SPD-treating these semiconductor nanocrystals (hereinafter, marked as 'SPD-QD'), a light emitting device manufactured by using the semiconductor nanocrystals of Preparation Example 1-3 (hereinafter, marked as 'BzA-QD', treated with 10 mM of BzA), and a light emitting device by SPD-treating the semiconductor nanocrystals (hereinafter, marked as 'BzA/SPD-QD') are measured for device performance, and the results are shown in Table 7.

Also listed in Table 7 are results of the oxalic acid (OxA) and citric acid (CtA) (also used in the same treatment amount of 10 mM) being substituted with the benzoic acid (BzA).

TABLE 7

| EA (4.4 V) | OA-QD | SPD-QD | BzA-QD | OxA-QD | CtA-QD | BzA/SPD-QD | OxA/SPD-QD | CtA/SPD-QD |
|---|---|---|---|---|---|---|---|---|
| EQE % Max | 12.5 | 12.4 | 10.5 | 10.1 | 12 | 14.2 | 11.8 | 11.7 |
| Lum Max ($Cd/m^2$) | 58360 | 61810 | 55210 | 33580 | 49270 | 69950 | 63720 | 54120 |
| EQE % @1000 nt | 12.3 | 11.7 | 9.9 | 9.8 | 11.9 | 14.1 | 11.7 | 11.6 |
| EQE % @10000 nt | 11.7 | 12.1 | 10.5 | 9 | 11.4 | 13 | 11.3 | 11.1 |
| EQE % @20000 nt | 10.1 | 10.7 | 9.5 | 7.5 | 9.6 | 11.5 | 10.6 | 9.7 |
| Cd/A Max | 11.5 | 11.3 | 9.3 | 8.9 | 11.1 | 13.9 | 11.1 | 11.2 |
| V @5 mA | 3.6 | 3.6 | 3.6 | 3.2 | 3.6 | 2.9 | 3.2 | 3.4 |
| $Cd/m^2$ @5 mA | 543 | 444 | 345 | 429 | 523 | 658 | 511 | 540 |
| V @1 nt | 2.6 | 2.7 | 2.7 | 2.6 | 2.6 | 2.4 | 2.5 | 2.5 |
| Lamda Max | 462 | 462 | 461 | 461 | 461 | 463 | 463 | 463 |
| FWHM | 38 | 38 | 37 | 36 | 38 | 38 | 39 | 39 |
| T90 (hr) | 3.78 | 4.75 | 2.9 | 0.05 | 0.99 | 4.59 | 2.22 | 1.56 |
| T50 (hr) | 18.5 | 24.4 | 17.6 | 0.5 | 9.3 | 33.7 | 17.4 | 15.2 |

Referring to Table 7, if the OA-QD or the SPD-QD films are treated with the benzoic acid (BzA), the oxalic acid (OxA), or the citric acid (CtA) alone, the device performance is shown to degrade. In contrast, if the SPD-QD film is treated with BzA device performance is maximized.

Experimental Example 5: Performance Evaluation 2 of Light Emitting Devices

A light-emitting film laminated in two layers is formed by using the semiconductor nanocrystals of Preparation Example 1-2, wherein one layer is SPD-treated in accordance with the method of Preparation Example 2-2 (hereinafter, marked as 'Cl/SPD-QD/Cl'). A light-emitting film laminated in two layers is formed by using the semiconductor nanocrystals of Preparation Example 1-3, wherein one layer is SPD-treated in accordance with the method of Preparation Example 2-2 (hereinafter, marked as 'BzA/SPD-QD/Cl'). A light-emitting film laminated in two layers is formed by using the semiconductor nanocrystals of Preparation Example 1-4, wherein one layer is SPD-treated in accordance with the method of Preparation Example 2-2 (hereinafter, marked as 'BzA/Cl/SPD-QD/Cl').

The performances of each light emitting device is measured, and the results are shown in Table 8. In Table 8, BzA (x1) means that the amount of BzA added is ten times as much as than BzA-QD (x0.1).

TABLE 8

| Upper/Lower layers (20 nm/20 nm) | CI/SPD-QD/CI | BzA(×0.1)/SPD-QD/CI | BzA(×1)/SPD-QD/CI | BzA(×0.1)/CI/SPD-QD/CI | BzA(×1)/CI/SPD-QD/CI |
|---|---|---|---|---|---|
| EQE Max % | 12.2 | 14.4 | 14.5 | 13.1 | 14.1 |
| Lum (Max) ($Cd/m^2$) | 56760 | 68120 | 72920 | 69370 | 73220 |
| EQE % @1000 nt | 12.1 | 12.9 | 12.5 | 12.1 | 11.9 |
| EQE % @10000 nt | 9.5 | 11.4 | 11.9 | 10.3 | 11.2 |
| EQE % @20000 nt | 8 | 9.6 | 10.4 | 8.9 | 9.6 |
| Cd/A Max | 13.4 | 15.2 | 14.8 | 14.6 | 14.6 |
| V @5 mA | 3.5 | 3.4 | 3.4 | 3.4 | 3.4 |
| $Cd/m^2$ @5 mA | 660 | 693 | 649 | 678 | 635 |
| V @1 nt | 2.6 | 2.5 | 2.5 | 2.6 | 2.5 |
| Lamda Max | 465 | 464 | 464 | 465 | 464 |
| FWHM | 41 | 42 | 41 | 41 | 41 |
| CIE x | 0.131 | 0.132 | 0.132 | 0.131 | 0.132 |
| CIE y | 0.146 | 0.142 | 0.138 | 0.153 | 0.143 |
| T95 (hr) | 9.79 | 16.94 | 14.6 | 17.67 | 16.04 |
| T50 (hr) | 75.6 @63% | 75.6 @70% | 75.6 @66% | 75.5 @74% | 62 @74% |
| OVS (%) | 101 | 102 | 102 | 102 | 102 |

Referring to Table 8, the performance of a light emitting device demonstrates excellent performance at 150° C., when the amount of BzA added is ten times increased from ×0.1 to ×1 (EQE ref. 13.3% ->15.3%, luminance: 70500 nit ->77400 nit).

Experimental Example 6: FT-IR Measurement of Light-Emitting Film

The light-emitting film formed by SPD-treating the semiconductor nanocrystals of Preparation Example 1-4 in accordance with the method of Preparation Example 2-2 (hereinafter, marked as 'BzA/Cl/SPD-QD') is measured with respect to FT-IR.

When mix-treated with BzA and $Cl^-$, BzA/Cl/SPD, the benzoate remains in the thin film. In other words, in the mix-treated BzA/Cl/SPD, BzA is absorbed in the benzoate (carboxylate (COO—) end), and accordingly, the film exhibits peaks of 1413 $cm^{-1}$ and 1596 $cm^{-1}$ compared with the SPD film.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

| | |
|---|---|
| 100: light emitting device | 123: substrate |
| 200: display device | 130: thin film transistor |
| 160: first electrode | 172: hole auxiliary layer |
| 173: light emitting layer | 174: electron auxiliary layer |
| 180: second electrode | |

What is claimed is:

1. A semiconductor nanocrystal comprising
   - an anion of an inorganic metal salt bound to a surface of the semiconductor nanocrystal, wherein the inorganic metal salt comprises an inorganic metal halide, an inorganic metal sulfate, an inorganic metal nitrate, an inorganic metal thiocyanate, or a combination thereof,
   - a first organic ligand bound to the surface of the semiconductor nanocrystal, wherein the first organic ligand comprises a substituted or unsubstituted C6 to C30 aromatic ring group and a carboxylate group, a substituted or unsubstituted C3 to C30 aromatic heterocyclic group and a carboxylate group, or a combination thereof, and
   - a second organic ligand,
   - wherein the semiconductor nanocrystal comprises a core comprising a first semiconductor nanocrystal and a shell disposed on the core, the shell comprising a second semiconductor nanocrystal having a composition different than that of the first semiconductor nanocrystal, and
   - wherein a weight ratio of the second organic ligand, the anion of the inorganic metal salt, and the first organic ligand is about 30 to 60:30 to 60:10 to 30, respectively.

2. The semiconductor nanocrystal of claim 1, wherein the first semiconductor nanocrystal comprises InP, InZnP, ZnSe, ZnSeTe, or a combination thereof.

3. The semiconductor nanocrystal of claim 1, wherein the second semiconductor nanocrystal comprises zinc and sulfur in an outermost shell layer.

4. The semiconductor nanocrystal of claim 1, wherein the metal of the inorganic metal salt is zinc (Zn), indium (In), gallium (Ga), magnesium (Mg), lithium (Li), nickel (Ni), tin (Sn), copper (Cu), silver (Ag), cobalt (Co), or a combination thereof.

5. The semiconductor nanocrystal of claim 1, wherein the inorganic metal salt comprises zinc chloride, zinc bromide, zinc iodide, zinc nitrate, zinc sulfate, zinc thiocyanate, indium chloride, indium bromide, indium iodide, indium nitrate, indium sulfate, indium thiocyanate, gallium chloride, gallium bromide, gallium iodide, gallium nitrate, gallium sulfate, gallium thiocyanate, magnesium chloride, magnesium bromide, magnesium iodide, magnesium nitrate, magnesium sulfate, magnesium thiocyanate, lithium chloride, lithium bromide, lithium Iodide, lithium nitrate, lithium sulfate, lithium thiocyanate, nickel chloride, nickel bromide, nickel iodide, nickel nitrate, nickel sulfate, nickel thiocyanate, tin chloride, tin bromide, tin iodide, tin nitrate, tin sulfate, tin thiocyanate, copper chloride, copper bromide, copper iodide, copper nitrate, copper sulfate, copper thiocyanate, silver chloride, silver bromide, silver iodide, silver nitrate, silver sulfate, silver thiocyanate, cobalt chloride, cobalt bromide, cobalt iodide, cobalt nitrate, cobalt sulfate, cobalt thiocyanate, or a combination thereof.

6. A light-emitting film comprising a plurality of the semiconductor nanocrystals,
   - wherein the plurality of semiconductor nanocrystals comprise an anion of an inorganic metal salt bound to a surface of the semiconductor nanocrystals, wherein the inorganic metal salt comprises an inorganic metal halide, an inorganic metal sulfate, an inorganic metal nitrate, an inorganic metal thiocyanate, or a combination thereof,
   - a first organic ligand bound to the surface of the semiconductor nanocrystals, wherein the first organic ligand comprises a substituted or unsubstituted C6 to C30 aromatic ring group and a carboxylate group, a substituted or unsubstituted C3 to C30 aromatic heterocyclic group and a carboxylate group, or a combination thereof, and
   - a second organic ligand,
   - wherein the semiconductor nanocrystals comprise a core comprising a first semiconductor nanocrystal and a shell disposed on the core, the shell comprising a second semiconductor nanocrystal having a composition different than that of the first semiconductor nanocrystal, and
   - wherein a weight ratio of the second organic ligand, the anion of the inorganic metal salt, and the first organic ligand is about 30 to 60:30 to 60:10 to 30, respectively.

7. A light emitting device, comprising
   - a first electrode and a second electrode each having a surface opposite the other, and
   - the light-emitting film according to claim 6 disposed between the first electrode and the second electrode.

8. The light emitting device of claim 7, wherein the light emitting device further comprises an electron auxiliary layer being an electron injecting layer (EIL), an electron transporting layer (ETL), a hole blocking layer (HBL), or a combination thereof, the electron auxiliary layer disposed between the second electrode and the light-emitting film.

9. The light emitting device of claim 7, wherein the electron auxiliary layer comprises nanoparticles comprising zinc metal oxide.

10. The light emitting device of claim 9, wherein the zinc metal oxide is represented by Chemical Formula 2:

Chemical Formula 2

$$Zn_{1-x}M_xO$$

- wherein, in Chemical Formula 2,
   - M is Mg, Ca, Zr, W, Li, Ti, Y, Al, or a combination thereof, and $0 \le x \le 0.5$.

11. A display device comprising the light emitting device of claim 7.

12. The semiconductor nanocrystal of claim 1, wherein the first organic ligand is represented by Chemical Formula 1:

Chemical Formula 1

$$X—L—Ar_1\text{—}[Y]_n$$

- wherein, in Chemical Formula 1,
   - $Ar_1$ is a substituted or unsubstituted monocyclic aromatic ring group, a substituted or unsubstituted condensed polycyclic aromatic ring group, or a combination thereof joined by a linker, or an aromatic ring group comprising two or more independently substituted or unsubstituted monocyclic aromatic ring groups, or two or more independently substituted or unsubstituted condensed polycyclic aromatic ring groups, each of which is joined by a linker, L is a single bond, a substituted or unsubstituted C1 to C30 alkylene group, or an unsaturated linker of —$CR^a$═$CR^b$— or —C≡C— (wherein, $R^a$ and $R^b$ are independently hydrogen, or an optionally substituted C1 to C10 alkyl group), X is a carboxylate group, Y is a hydroxy group, a halogen, an amine group, or a nitro group, and n is an integer of 0 to 6.

13. The semiconductor nanocrystal of claim 12, wherein the monocyclic or condensed polycyclic aromatic ring group comprises a structural moiety of benzene, biphenyl, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopurine, isoquinoline, purine or a combination thereof.

14. The semiconductor nanocrystal of claim 1, wherein the first organic ligand comprises benzoate, hydroxyl benzoate, halo-benzoate, amino-benzoate, nitro-benzoate, 4-biphenyl carboxylate, cinnamate acid, or a combination thereof.

15. The semiconductor nanocrystal of claim 1, further comprising a second organic ligand comprising an anion of RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO $(OH)_2$, RHPOOH, or $R_2POOH$ (wherein, R and R' are independently hydrogen, C1 to C40 substituted or unsubstituted aliphatic hydrocarbon, or C6 to C40 substituted or unsubstituted aromatic hydrocarbon, or a combination thereof, and in each ligand, at least one R is not hydrogen), which is bound to the surface of the semiconductor nanocrystal.

16. A semiconductor nanocrystal comprising an anion of an inorganic metal salt bound to a surface of the semiconductor nanocrystal, wherein the inorganic metal salt comprises an inorganic metal sulfate, an inorganic metal nitrate, an inorganic metal thiocyanate, or a combination thereof, wherein the semiconductor nanocrystal comprises a first semiconductor nanocrystal and a second semiconductor nanocrystal disposed around the first semiconductor nanocrystal, the second semiconductor nanocrystal having a composition different than that of the first semiconductor nanocrystal, and the first semiconductor nanocrystal comprises InP, InZnP, ZnSe, ZnSeTe, or a combination thereof, a first organic ligand comprises benzoate, hydroxyl benzoate, halo-benzoate, amino-benzoate, nitro-benzoate, 4-biphenyl carboxylate, cinnamate acid, or a combination thereof, and a second organic ligand comprising an anion of RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, or $R_2POOH$, which is bound to the surface of the semiconductor nanocrystal, wherein, R and R' are independently hydrogen, C1 to C40 substituted or unsubstituted aliphatic hydrocarbon, or C6 to C40 substituted or unsubstituted aromatic hydrocarbon, or a combination thereof, and in each ligand, at least one R is not hydrogen, wherein a weight ratio of the second organic ligand, the anion of the inorganic metal salt, and the first organic ligand is about 30 to 60:30 to 60:10 to 30, respectively.

* * * * *